United States Patent
Namkung et al.

(10) Patent No.: US 10,678,304 B2
(45) Date of Patent: Jun. 9, 2020

(54) DISPLAY DEVICE AND METHOD OF MANUFACTURING A DISPLAY DEVICE

(71) Applicant: Samsung Display Co., Ltd., Yongin-si, Gyeonggi-do (KR)

(72) Inventors: Jun Namkung, Asan-si (KR); Soon-Ryong Park, Sejong-si (KR); Seok-Gi Baek, Yongin-si (KR); Chul-Woo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 25 days.

(21) Appl. No.: 15/947,711

(22) Filed: Apr. 6, 2018

(65) Prior Publication Data

US 2018/0224894 A1  Aug. 9, 2018

Related U.S. Application Data

(63) Continuation of application No. 14/523,811, filed on Oct. 24, 2014, now Pat. No. 9,939,846.

(30) Foreign Application Priority Data

Feb. 12, 2014 (KR) .................. 10-2014-0015972

(51) Int. Cl.
*G06F 3/041* (2006.01)
*G06F 1/16* (2006.01)
*H01L 27/32* (2006.01)

(52) U.S. Cl.
CPC .......... *G06F 1/1652* (2013.01); *G06F 1/1643* (2013.01); *G06F 3/0412* (2013.01); *H01L 27/323* (2013.01); *H01L 27/3267* (2013.01); *G06F 2203/04102* (2013.01); *G06F 2203/04103* (2013.01); *H01L 2251/5338* (2013.01); *Y10T 156/1026* (2015.01)

(58) Field of Classification Search
CPC .... G06F 1/1652; G06F 3/0412; G06F 1/1643; G06F 2203/04102; G06F 2203/04103; H01L 27/323; H01L 27/3267; H01L 2251/5338; Y10T 156/1026
See application file for complete search history.

(56) References Cited

U.S. PATENT DOCUMENTS

| | | |
|---|---|---|
| 8,736,556 B2 | 5/2014 | Park et al. |
| 8,912,544 B2 | 12/2014 | Yamazaki et al. |
| 2006/0098153 A1 | 5/2006 | Slikkerveer et al. |
| 2010/0064244 A1* | 3/2010 | Kilpatrick, II ........ G06F 1/1616 715/773 |

(Continued)

FOREIGN PATENT DOCUMENTS

| | | |
|---|---|---|
| CN | 1497419 A | 5/2004 |
| CN | 101261553 A | 9/2008 |

(Continued)

*Primary Examiner* — Towfiq Elahi
(74) *Attorney, Agent, or Firm* — Lewis Roca Rothgerber Christie LLP

(57) ABSTRACT

Provided is a display device including: a bottom member; a display panel on the bottom member, the display panel configured to emit light; a top member on the display panel; a touch screen panel on the top member; and a groove region formed by removing at least a portion of at least one of the top member and the bottom member at a bent portion of the display device.

29 Claims, 12 Drawing Sheets

(56) References Cited

U.S. PATENT DOCUMENTS

| | | |
|---|---|---|
| 2010/0143595 A1 | 6/2010 | Nara et al. |
| 2011/0141042 A1* | 6/2011 | Kim ................... G02F 1/13338 345/173 |
| 2012/0140143 A1 | 6/2012 | Wurzel |
| 2013/0002133 A1* | 1/2013 | Jin ..................... H01L 51/5253 313/511 |
| 2013/0002583 A1 | 1/2013 | Jin et al. |
| 2014/0042406 A1* | 2/2014 | Degner ................ H01L 27/326 257/40 |
| 2014/0049449 A1* | 2/2014 | Park ........................ G09G 5/00 345/1.3 |
| 2016/0370827 A1 | 12/2016 | Jin et al. |
| 2017/0269635 A1 | 9/2017 | Iwase |

FOREIGN PATENT DOCUMENTS

| | | |
|---|---|---|
| CN | 102403333 A | 4/2012 |
| CN | 102855821 A | 1/2013 |
| EP | 1 248 228 A1 | 10/2002 |
| EP | 1 752 818 A2 | 2/2007 |
| EP | 1 830 336 A1 | 9/2007 |
| JP | 2004-145878 | 5/2004 |
| KR | 10-2005-0085066 A | 8/2005 |
| KR | 10-2011-0068169 | 6/2011 |
| KR | 10-2011-0120858 A | 11/2011 |
| KR | 10-2013-0004085 A | 1/2013 |
| KR | 2013-0081875 | 7/2013 |
| KR | 10-2015-0007632 | 1/2015 |
| WO | WO 2009/111660 A1 | 9/2009 |

\* cited by examiner

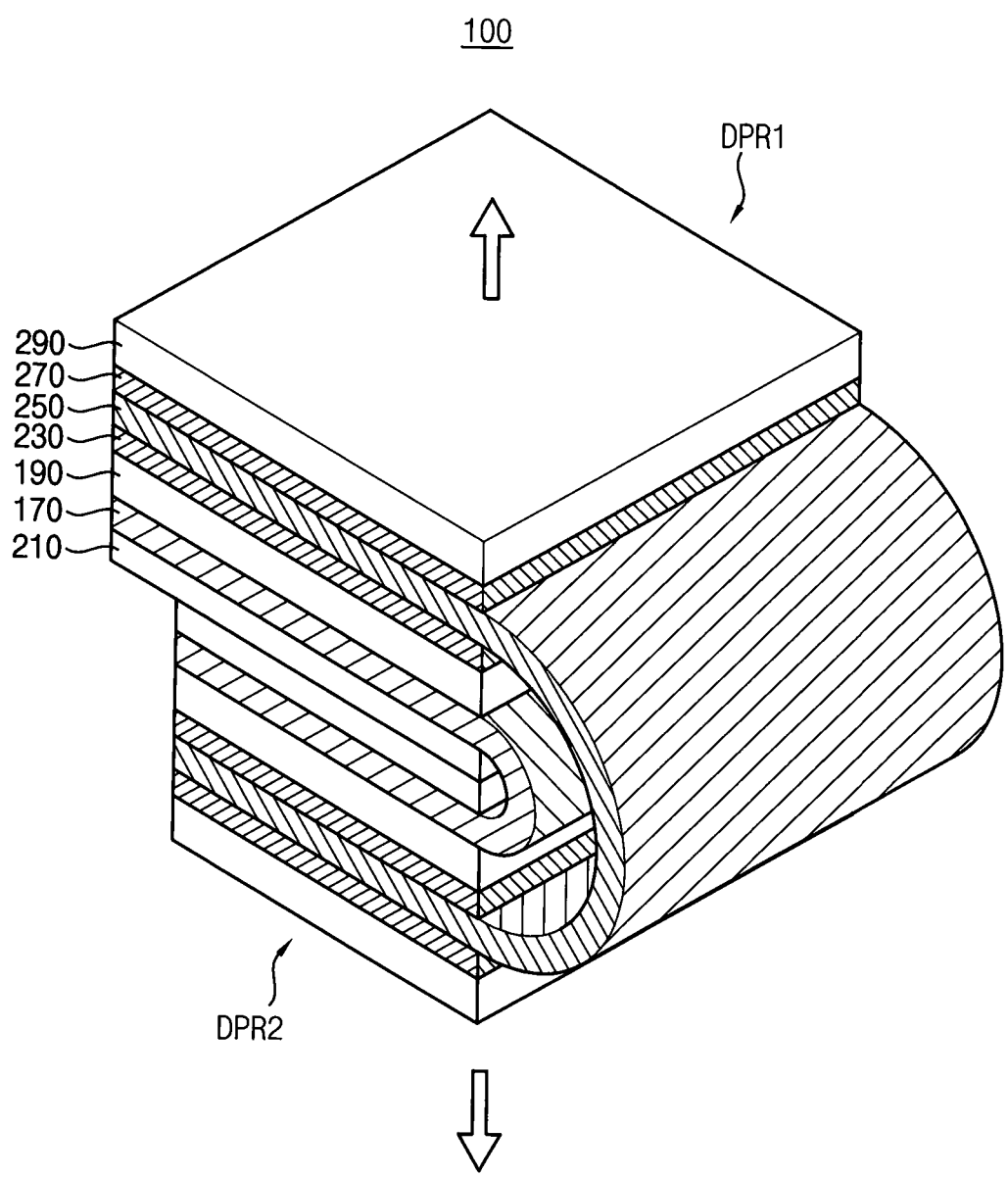

DISPLAY DEVICE AND METHOD OF MANUFACTURING A DISPLAY DEVICE

CROSS REFERENCE TO RELATED APPLICATION

This application is a continuation of U.S. patent application Ser. No. 14/523,811, filed Oct. 24, 2014, which claims priority to and the benefit of Korean Patent Application No. 10-2014-0015972, filed Feb. 12, 2014, the entire content of both of which is incorporated herein by reference.

BACKGROUND

1. Field

Aspects of example embodiments of the present invention are directed towards bendable or foldable display devices, and methods of manufacturing the display devices.

2. Description of the Related Art

A conventional organic light emitting diode (OLED) display device includes an encapsulation unit, a bottom substrate, and an organic emission structure disposed between the encapsulation unit and the bottom substrate, etc. The conventional OLED display device typically includes a glass substrate as the bottom substrate and/or a top substrate. As manufacturing techniques of the OLED display device have been developed, the glass substrate is replaced with a transparent plastic substrate (e.g., a polyimide substrate) having flexibility, to manufacture a flexible display device having the flexibility. Further, the flexible display device has been researched and developed to have various shapes. The flexible display device should be completely bent or folded to display images on both sides of the display device (e.g., top and bottom surfaces of the display device). However, since the flexible display device may have a polarizer, a touch screen panel, a window, a bottom film, etc., the flexible display device may have a large thickness, and it may be difficult for the flexible display device having the large thickness to be completely bent or folded. When the flexible display device is bent or folded by force, the flexible display device can be damaged.

SUMMARY

Aspects of example embodiments are directed toward a display device including a groove region at a bent portion of the display device.

Aspects of example embodiments are directed toward a method of manufacturing the display device.

According to example embodiments, a display device includes: a bottom member; a display panel on the bottom member, the display panel configured to emit light; a top member on the display panel; a touch screen panel on the top member; and a groove region formed by removing at least a portion of at least one of the top member and the bottom member at a bent portion of the display device.

In example embodiments, the groove region includes: a first groove formed by removing at least a portion of the top member at the bent portion of the display device; and a second groove formed by removing at least a portion of the bottom member at the bent portion of the display device.

In example embodiments, a first neutral plane at the bent portion of the display device is formed within the display panel.

In example embodiments, the display panel includes a first display panel region and a second display panel region at sides of the groove region. The first display panel region may be at a first surface of the display device and may be configured to display an image from the first surface, and the second display region may be at a second surface of the display device opposite to the first surface and may be configured to display an image from the second surface, when the display device is bent.

In example embodiments, the display panel includes: a first display panel region at a front surface of the display device and configured to display an image from the front surface; a second display panel region at a left surface of the display device and configured to display an image from the left surface; a third display panel region at a right surface of the display device and configured to display an image from the right surface; and a fourth display panel region at a rear surface of the display device and configured to display an image from the rear surface. The groove region may include a plurality of grooves that are formed between the first and second display panel regions, between the second and third display panel regions, and between the third and fourth display panel regions, respectively.

In example embodiments, the display panel includes a curved display panel region having a curved shape. The groove region may include a plurality of grooves that are spaced from each other by a distance at the curved display panel region.

In example embodiments, the display panel further includes a flat display panel region having a flat shape. The groove region may further include a groove between the curved display panel region and the flat display panel region, and a width of each groove at the curved display panel region may be less than that of the groove between the curved display panel region and the flat display panel region.

In example embodiments, the groove region is a laser irradiated groove.

In example embodiments, the bottom member includes a bottom film, and the top member includes a polarizer.

In example embodiments, the display device further includes a transparent member on the touch screen panel.

In example embodiments, at least a portion of the transparent member is removed at the bent portion of the display device.

In example embodiments, a second neutral plane at the bent portion of the display device is within the touch screen panel.

In example embodiments, the display device further includes: a first adhesive between the top member and the touch screen panel; and a second adhesive between the touch screen panel and the transparent member.

In example embodiments, the touch screen panel has mobility between the first and second adhesives.

In example embodiments, the groove region includes: a first groove formed by removing at least a portion of the top member at the bent portion of the display device; a second groove formed by removing at least a portion of the bottom member at the bent portion of the display device; a third groove formed by removing at least a portion of the transparent member and the second adhesive at the bent portion of the display device; and a fourth groove formed by removing at least a portion of the first adhesive at the bent portion of the display device.

In example embodiments, a first neutral plane at the bent portion of the display device is within the display panel, and a second neutral plane at the bent portion of the display device is within the touch screen panel.

In example embodiments, the display panel includes an encapsulation unit and a bottom substrate, and at least a portion of at least one of the encapsulation unit and the bottom substrate is removed at the bent portion of the display device.

According to another example embodiments, a method of manufacturing a display device includes: forming a display panel configured to emit light; forming a top member and a bottom member on upper and lower surfaces of the display panel, respectively; forming a first groove region by removing at least a portion of at least one of the top member and the bottom member at a bent portion of the display device; forming a touch screen panel on the display panel; and bending the display device at the first groove region.

In example embodiments, the first groove region includes: a first groove formed by removing at least a portion of the top member at the bent portion of the display device; and a second groove formed by removing at least a portion of the bottom member at the bent portion of the display device.

In example embodiments, a first neutral plane at the bent portion of the display device is formed within the display panel.

In example embodiments, the forming of the touch screen panel on the display panel includes: forming first and second adhesives on upper and lower surfaces of the touch screen panel, respectively; forming a transparent member on the second adhesive; forming a second groove region by removing at least a portion of at least one of the first adhesive, the second adhesive, and the transparent member at the bent portion of the display device; and forming the touch screen panel at where the first adhesive, the second adhesive, and the transparent member are formed, on the display panel at where the bottom member and the top member are formed.

In example embodiments, the second groove region includes: a third groove formed by removing at least a portion of the transparent member and the second adhesive at the bent portion of the display device; and a fourth groove formed by removing at least a portion of the first adhesive at the bent portion of the display device.

In example embodiments, a second neutral plane at the bent portion of the display device is formed within the touch screen panel.

In example embodiments, the touch screen panel has mobility between the first and second adhesives.

In example embodiments, the forming of the second groove region includes irradiating a laser at the first adhesive, the second adhesive, and the transparent member to remove the first adhesive, the second adhesive, and the transparent member at the bent portion of the display device.

In example embodiments, the forming of the first groove region includes irradiating a laser at the top member and the bottom member to remove the top member and the bottom member at the bent portion of the display device.

As the display device and the method of manufacturing the display device according to example embodiments have the groove region, the display device and the method of manufacturing the display device can provide the display device capable of displaying images from various surfaces (e.g., front surface and rear surface).

BRIEF DESCRIPTION OF THE DRAWINGS

Example embodiments can be understood in more detail from the following description taken in conjunction with the accompanying drawings, in which:

FIG. 5 is a perspective view illustrating a display device according to example embodiments;

DETAILED DESCRIPTION

Figure 1:
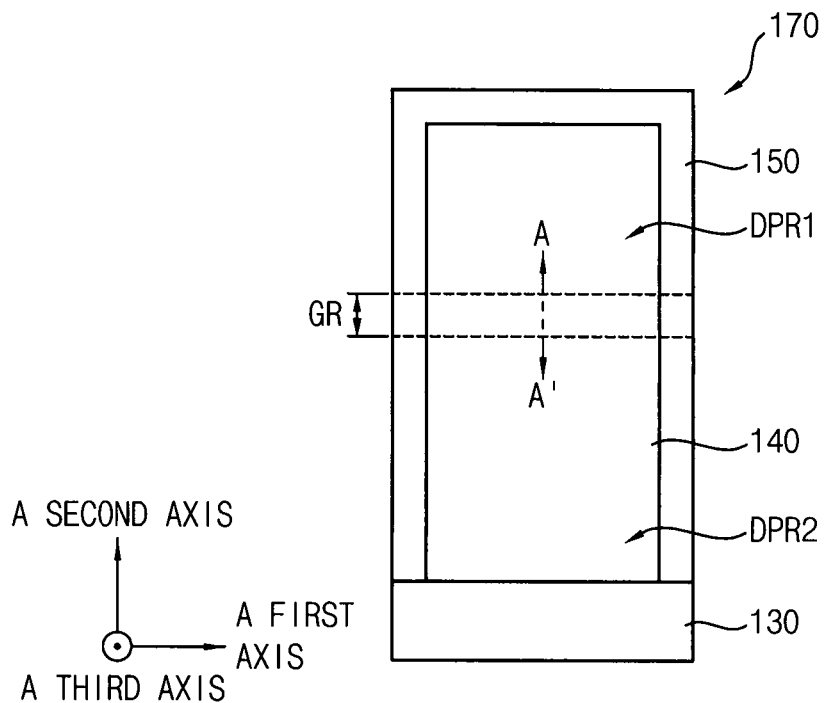
FIG. 1 is a plan view illustrating a display panel before being bent according to example embodiments.

Hereinafter, example embodiments of the present invention will be described in detail with reference to the accompanying drawings. Expressions such as "at least one of," when preceding a list of elements, modify the entire list of elements and do not modify the individual elements of the list. Further, the use of "may" when describing embodiments of the present invention refers to "one or more embodiments of the present invention." In the drawings, identical or similar reference numerals may represent identical or similar elements.

FIG. 1 is a plan view illustrating a display panel before being bent according to example embodiments.

Referring to FIG. 1, a display panel 170 may include a display unit 140, a pad unit 130, a peripheral unit 150, and a groove region GR. In the display panel 170 illustrated in FIG. 1, the groove region GR may be formed between a plurality of display regions included in the display panel 170. For example, the display panel 170 may include a first display panel region DPR1 and a second display panel region DPR2, and the groove region GR may be formed between the first display panel region DPR1 and the second display panel region DPR2 along a first axis direction.

The display unit 140 may be surrounded by the pad unit 130 and the peripheral unit 150. The display unit 140 may display an image. The display panel 170 may include an encapsulation unit, a light emitting layer, a bottom substrate, etc. In example embodiments, to increase the flexibility of the display panel 170, the encapsulation unit may include a stacked structure where at least one organic layer and at least one inorganic layer are alternately stacked. The bottom substrate may include a polyimide substrate. The encapsulation unit including the stacked structure and the polyimide substrate may improve the flexibility of the display panel 170. A transparent member, a touch screen panel, a polarizer, a bottom film, etc. may be additionally disposed on an upper surface (e.g., in a third axis direction) or a lower surface (e.g., in a direction opposite to the third axis direction) of the display panel 170. In example embodiments, when the groove region GR is formed at the transparent member that is disposed on the display panel 170, the groove region GR may be formed by irradiating a laser on the transparent member. The transparent member may include a transparent plastic-based material.

The pad unit 130 may be disposed at a lower portion of the display unit 140 in a second axis direction that is perpendicular or substantially perpendicular to the first axis direction from the display unit 140. The pad unit 130 may be electrically coupled (e.g., electrically connected) to the display unit 140. The pad unit 130 may transmit image signals to the display unit 140. The display unit 140 may display the image in response to the image signals. For example, the pad unit 130 may include a driving integrated circuit (e.g., a driving IC), or the like. In addition, the pad unit 130 may be electrically coupled to an external module configuration.

The peripheral unit 150 may be disposed at opposite side portions (e.g., left side and right side) of the display unit 140 in the first axis direction from the display unit 140, and at an upper portion of the display unit 140 in the second axis direction from the display unit 140. The peripheral unit 150 may be electrically coupled to the display unit 140 and the pad unit 130. In addition, the peripheral unit 150 may transmit the signals from the pad unit 130 to the display unit 140. For example, the peripheral unit 150 may include data lines, voltage lines, on-off switch lines, reference lines, a gate driving unit, etc.

The groove region GR may be formed between the first display panel region DPR1 and the second display panel region DPR2 along the first axis direction, such that the display panel 170 is divided into the first display panel region DPR1 and the second display panel region DPR2. For example, the groove region GR may be formed by removing at least a portion of an additional structure (e.g., a bottom member, a top member, an adhesive, a touch screen panel, a transparent member, etc.) formed on a top surface and/or a bottom surface of the display panel 170.

A width of the groove region GR in the second axis direction may be determined depending on a bending radius (e.g., a folding radius) of the display panel 170. The groove region GR may be formed by a laser irradiation. For example, the laser may use a CO2 laser source having high energy efficiency. In example embodiments, the laser irradiation may be performed in single scan or multi scan methods according to the width (e.g., a desired width) of the groove region GR. For example, when the width of the groove region GR is greater than a width of the irradiated laser, the laser may be repeatedly irradiated along the second axis (or first axis) direction to form the groove region GR having the desired width.

Figure 2:
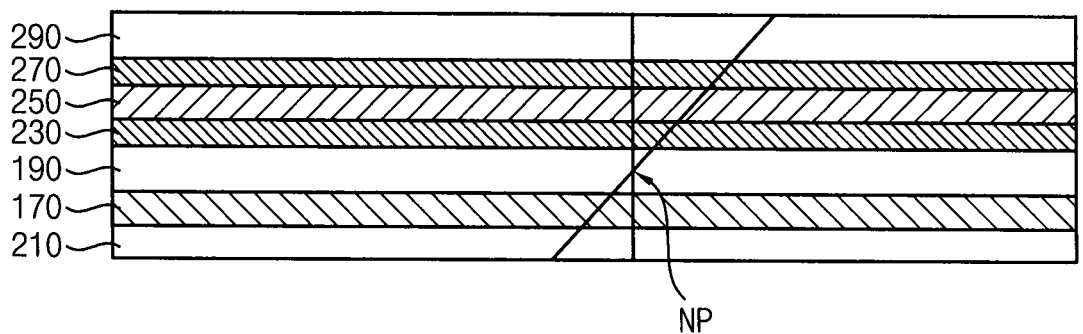
FIG. 2 is a cross-sectional view illustrating a neutral plane of a display device where no groove region is formed.

FIG. 2 is a cross-sectional view illustrating a neutral plane of a display device where no groove region is formed.

Referring to FIG. 2, a display device may include a bottom member 210, a display panel 170, a top member 190, a first adhesive 230, a touch screen panel 250, a second adhesive 270, and a transparent member 290.

A neutral plane of the display device may be formed at the top member 190. Here, the neutral plane may relate to a plane that is neither increased nor decreased in a cross-sectional size of an object when the object is bent. When the object comprises a same material, the neutral plane corresponds to a midplane of the object. However, when the object comprises at least two materials (e.g., a composite material), the neutral plane may be different from the midplane of the composite material. When the display device is bent without the groove region GR, as described above, the neutral plane is not formed within the display panel 170 (e.g., the neutral plane is formed within the top member 190). Thus, the display panel 170 may be damaged, broken, and/or cut.

Figure 3:
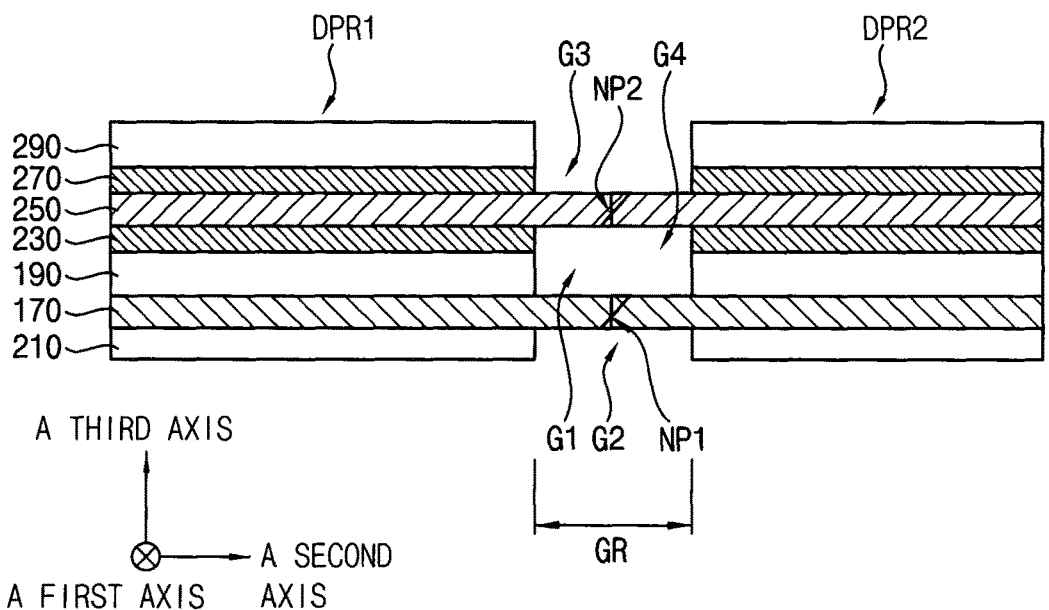
FIG. 3 is a cross-sectional view taken along the line A-A' of FIG. 1, illustrating a neutral plane of the display device where a groove region is formed.

FIG. 3 is a cross-sectional view taken along a line A-A' of FIG. 1, illustrating a neutral plane of the display device where a groove region is formed.

Referring to FIG. 3, a display device may include a bottom member 210, a display panel 170, a top member 190, a first adhesive 230, a touch screen panel 250, a second adhesive 270, a transparent member 290, and a groove region GR.

The bottom member 210 may include a bottom film pressure sensitive adhesive (PSA), a bottom film polyethylene terephthalate (PET), etc. The bottom member 210 may protect a bottom substrate (e.g., a polyimide substrate) of the display panel 170. When the groove region GR is formed on the display device, a recess which is formed at the bottom member 210 is defined as a second groove G2. For example, the second groove G2 may be formed by irradiating a laser on the bottom member 210.

The laser may use a CO2 laser source having the high energy efficiency. In example embodiments, the laser irradiation may be performed in a multi scan method according to the width (e.g., desired width) of the groove region GR. For example, when the width of the groove region GR is greater than a width of the irradiated laser, the laser may be repeatedly irradiated along the second axis (or first axis) direction to form the groove region GR having the width. In a bent portion of the display device, at least a portion of the bottom member 210 may be removed by a laser, or the bottom member 210 may be completely removed by the laser at the bent portion. For example, a depth of the second groove G2 in the third axis direction may be about 20 Å to about 100 Å.

The bottom film PSA of the bottom member 210 may be disposed at a lower surface of the display panel 170. The bottom substrate of the display panel 170 and the bottom film PET may be bonded by the bottom film PSA. The bottom film PSA may include urethane-based materials, acryl-based materials, silicon-based materials, etc.

The bottom film PET may be disposed on a lower surface of the bottom film PSA. The bottom film PET may protect a lower surface of the display panel 170. For example, the bottom film PET may include polyethylene terephthalate (PET), polyethylene naphthalate (PEN), polypropylene (PP), polycarbonate (PC), polystyrene (PS), polysulfone (PSul), polyethene (PE), polyphthalamide (PPA), polyethersulfone (PES), polyarylate (PAR), polycarbonate oxide (PCO), modified polyphenylene oxide (MPPO), etc.

The display panel 170 may be disposed on the bottom member 210. The display panel 170 may include the bottom substrate, a switching element, an anode electrode, an emission layer, a cathode electrode, an encapsulation unit, etc.

The bottom substrate may include a polyimide substrate. The polyimide substrate may include a single polyimide layer or a plurality of polyimide layers. For example, the polyimide substrate may include a first polyimide layer, a barrier film layer, a second polyimide layer, etc. The first polyimide layer is disposed on a glass substrate, and the barrier film layer is disposed on the first polyimide layer. Also, the second polyimide layer may be disposed on the barrier film layer. After a buffer layer (e.g., an insulating layer) is disposed on the second polyimide layer, the switching element, the anode electrode, the emission layer, the cathode electrode, etc., may be disposed on the buffer layer. After the switching element, the anode electrode, the emission layer, the cathode electrode, etc., are disposed on the buffer layer, the glass substrate may be removed. In example embodiments, at the bent portion of the display device, the display panel 170 may include a recess which removes at least a portion of at least one of the encapsulation unit and the bottom substrate. Here, the recess which is formed at the bottom substrate may include the barrier film layer and the first polyimide layer, except the second polyimide layer.

The switching element may be disposed on the bottom substrate. The switching element may control emission of the light. In example embodiments, the switching element may correspond to a semiconductor element including an active layer which is formed as an oxide semiconductor, an inorganic semiconductor (e.g., an amorphous silicon, a poly silicon), an organic semiconductor, etc. The switching element may be electrically coupled (e.g., electrically connected) to the anode electrode. The anode electrode may be disposed on the switching element, and the cathode electrode may be disposed on the anode electrode. The anode electrode and the cathode electrode may include metal, alloy, metallic nitride, conductive metal oxide, a transparent conductive material, etc. For example, the anode electrode and the cathode electrode may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used (or utilized) alone or in a combination thereof.

The emission layer may be disposed on the anode electrode. The emission layer may generate light. For example, the emission layer may be disposed between the anode electrode and the cathode electrode.

The emission layer may be a multilayered structure which includes an organic light emitting layer (EML), a hole injection layer (HIL), a hole transfer layer (HTL), an electron transfer layer (ETL), an electron injection layer (EIL), etc. In example embodiments, the EML of the emission layer may include light emitting materials capable of generating different colors of light such as a red color of light, a blue color of light, and/or a green color of light according to the kinds of pixels included in the display device. In some example embodiments, the EML of the emission layer may generally generate a white color of light by stacking a plurality of light emitting materials capable of generating different colors of light such as a red color of light, a green color of light, a blue color of light, etc.

The encapsulation unit may be disposed on the cathode electrode, and the encapsulation unit may be positioned opposite to the bottom substrate. The encapsulation unit may be formed using (or utilizing) a transparent insulating material, a flexible material, etc. The encapsulation unit may include a stacked structure, where at least one organic layer and at least one inorganic layer are alternately stacked. For example, the inorganic layer may include silicon oxide, silicon nitride, silicon oxynitride, silicon oxycarbide, silicon carbonitride, aluminium oxide, aluminium nitride, titanium oxide, zinc oxide, etc. The organic layer may include acrylate monomer, phenylacetylene, diamine, dianhydride, siloxane, silane, parylene, the olefin-based polymer, polyethylene terephthalate, fluorine resin, polysiloxane, etc. In example embodiments, at the bent portion of the display device, the display panel 170 may include a recess which removes at least a portion of at least one of the encapsulation unit and the bottom substrate of the display panel 170. As described above, the encapsulation unit including the stacked structure and the polyimide substrate may improve the flexibility of the display device. For example, the polyimide substrate may improve the flexibility of the display device.

The top member 190 may be disposed on the display panel 170. The top member 190 may include a polarizer. For example, the polarizer may include polyvinylalcohol-based resin film, or the like. When the groove region GR is formed in the display device, a recess which is formed in the top member 190 is defined as a first groove G1. For example, the first groove G1 may be formed by irradiating a laser on the top member 190. The laser may use a CO2 laser source having high energy efficiency. In example embodiments, the laser irradiation may be performed in a multi scan method according to the width (e.g., desired width) of the groove region GR. For example, when the width of the groove region GR is greater than a width of the irradiated laser, the laser may be repeatedly irradiated along the second axis direction (or first axis direction) to form the groove region GR having the width. At the bent portion of the display device, at least a portion of the top member 190 may be removed by a laser, or the top member 190 may be completely removed by a laser at the bent portion. For example, a depth of the first groove G1 in the third axis direction may be formed by removing about 10% to about 100% of a thickness of the top member 190. Here, the depth and the width of the groove region GR may be determined according to the bending degree (e.g., a bending radius). When the depth is determined to be about 10% of the thickness of the top member 190, the bending radius may be small (e.g., a shape of the display panel 170 may have a gradually curved surface in the groove region GR). In addition, when the depth is determined to be about 100% of the thickness of the top member 190, the bending radius may be large (e.g., a shape of the display panel 170 may have a semicircle shape in the groove region GR).

In example embodiments, the polarizer may block an incident light of an outside. The polarizer may include a linearly polarized layer and a λ/4 phase retardation layer. Here, the linear polarization layer is disposed on the λ/4 phase retardation layer. For example, the linearly polarized layer may include iodine-based materials, materials containing dye, polyene-based materials, etc. Also, the λ/4 phase retardation layer may include a birefringent film containing polymer, an orientation film of a liquid crystal polymer, alignment layer of a liquid crystal polymer, etc.

The linearly polarized layer may selectively transmit the incident light. For example, the linearly polarized layer may transmit the light vibrating up and down or vibrating left and right. In this case, the linearly polarized layer may include a pattern of horizontal stripes or vertical stripes. When the linearly polarized layer includes a pattern of horizontal stripes, the linearly polarized layer may block the light vibrating up and down, and may transmit the light vibrating left and right. When the linearly polarized layer includes a pattern of vertical stripes, the linearly polarized layer may block the light vibrating left and right, and may transmit the light vibrating up and down.

The λ/4 phase retardation layer may convert a phase of the light. For example, the λ/4 phase retardation layer may convert the light vibrating up and down or the light vibrating left and right into right-circularly polarized light or left-circularly polarized light, respectively. In addition, the λ/4 phase retardation layer may convert the right-circularly polarized light or the left-circularly polarized light into the light vibrating up and down or the light vibrating left and right, respectively. For example, when the incident light vibrating up, down, left, and right passes through the linearly polarized layer, the linearly polarized layer including a pattern of the horizontal stripes may transmit the light vibrating left and right. When the incident vibrating left and right passes through the λ/4 phase retardation layer, the incident light vibrating left and right may be converted into the left-circularly polarized light. The incident light including the left-circularly polarized light may be reflected at the cathode electrode of the display panel 170, and then the incident light may be converted into the right-circularly polarized light. When the incident light including the right-circularly polarized light passes through the λ/4 phase retardation layer, the incident light may be converted into the light vibrating up and down. Here, the light vibrating up and down may be blocked by the linearly polarized layer including a pattern of the horizontal stripes. Accordingly, the incident light may be removed by the linearly polarized layer and the λ/4 phase retardation layer (e.g., polarizer).

When the groove region GR is not formed in the display device, a first neutral plane (NP1) of the bottom member 210, the display panel 170, and the top member 190 may be formed within the top member 190. In this case, when the display device is bent, the display panel 170 of the display device may be damaged. On the other hand, when the groove region GR is formed in the display device, the NP1 at the bent portion of the display device may be formed within the display panel 170. When the NP1 is formed within the display panel 170, the display panel 170 of the display device may not be damaged, so that the display device may be readily bent. A shape of the groove region GR once it is bent may have a semicircle shape.

In embodiments of the present invention, the neutral plane may relate to a plane that is neither increased nor decreased in a cross-sectional size of the object when the object is bent. When the object comprises the same material, the neutral plane corresponds to a midplane of the object. However, when the object comprises a composite material which is composed of at least two materials, the neutral plane may be different from the midplane of the composite material. When the groove region GR is not formed within the display device, the NP1 of the bottom member 210, the display panel 170, and the top member 190 of the display device may be formed within the top member 190. In the display device according to example embodiments, the groove region GR may be formed in the display device so that a position of the NP1 is changed. For example, as the bottom member 210 and the top member 190 are removed at the bent portion of the display device, the groove region GR may be formed at the bent portion of the display device. The NP1 of the bottom member 210, the display panel 170, and the top member 190 at the bent portion of the display device may be formed within the display panel 170. Accordingly, in embodiments of the present invention, the display panel 170 is not easily damaged, and thus the display device may be readily bent.

The first adhesive 230 may be disposed on the top member 190. The second adhesive 270 may be disposed on the touch screen panel 250. The first adhesive 230 may adhere to the top member 190 and the touch screen panel 250. The second adhesive 270 may adhere to the touch screen panel 250 and the transparent member 290. For example, the first adhesive 230 and the second adhesive 270 may include an optical clear adhesive film, pressure sensitive adhesive film, etc. The optical clear adhesive film and the pressure sensitive adhesive film may include urethane-based materials, acryl-based materials, silicon-based materials, etc. However, the first adhesive 230 and the second adhesive 270 may have a low viscosity and a low adhesiveness so that the touch screen panel 250 has mobility between the first adhesive 230 and the second adhesive 270. When the groove region GR is formed in the display device, a recess which is formed at the first adhesive 230 is defined as a fourth groove G4. The fourth groove G4 may be formed by irradiating a laser on the first adhesive 230. For example, the laser may use (or utilize) a $CO_2$ laser source having high energy efficiency. In example embodiments, the laser irradiation may be performed in a multi scan method according to the width of the groove region GR. For example, when the width (e.g., desired width) of the groove region GR is greater than a width of the irradiated laser, the laser may be repeatedly irradiated along the second axis direction (or first axis direction) to form the groove region GR having the width. At the bent portion of the display device, at least a portion of the first adhesive 230 and the second adhesive 270 may be removed by a laser, or the first adhesive 230 and the second adhesive 270 may be completely removed by a laser at the bent portion.

The transparent member 290 may be disposed on the second adhesive 270. When the groove region GR is formed in the transparent member 290, the transparent member 290 may include transparent plastic materials. For example, the transparent member 290 may be formed as a plastic window. Here, the plastic window may include a plastic having transparency of above about 95%.

When the groove region GR is formed in the display device, a recess which is formed at the second adhesive 270 and the transparent member 290 is defined as a third groove G3. The third groove G3 may be formed by irradiating a laser on the transparent member 290. For example, the laser may use (or utilize) a $CO_2$ laser source having the high energy efficiency. In example embodiments, the laser irradiation may be performed in a multi scan method according to the width (e.g., desired width) of the groove region GR. For example, when the width of the groove region GR is greater than a width of the irradiated laser, the laser may be repeatedly irradiated along the second axis direction (or first axis direction) to form the groove region GR having the width. At the bent portion of the display device, at least a portion of the transparent member 290 may be removed by a laser, or the transparent member 290 may be completely removed by a laser at the bent portion.

The touch screen panel 250 may be disposed between the first adhesive 230 and the second adhesive 270. In one example embodiment, the touch screen panel 250 may include a bottom PET film and touch screen panel electrodes. According to example embodiments, the touch screen panel 250 may further include a top PET film. The bottom PET film and/or the top PET film may protect the touch screen panel electrodes. For example, the top PET film and the bottom PET film may include the PET, the PEN, the PP, the PC, the PS, the PSul, the PE, the PPA, the PES, the PAR, the PCO, the MPPO, etc. A thickness of the bottom PET film may be about 80 Å. Also, a thickness of the top PET film may be from about 40 Å to about 60 Å. The touch screen panel electrodes may substantially have a metal mesh structure. For example, the touch screen panel electrodes may include carbon nano tube (CNT), transparent conductive oxide (TCO), indium tin oxide (ITO), indium gallium zinc oxide (IGZO), zinc oxide (ZnO), graphene, silver nanowire (AgNW), copper (Cu), chrome (Cr), etc. When the fourth groove G4 is formed by irradiating a laser, the fourth groove G4 may include at least a portion of the bottom PET film of the touch screen panel 250. Also, when the third groove G3 is formed by irradiating a laser, the third groove G3 may include at least a portion of the top PET film of the touch screen panel 250.

When the groove region GR is not formed in the display device, a second neutral plane (NP2) of the first adhesive 230, the touch screen panel 250, the second adhesive 270, and the transparent member 290 may be formed at the transparent member 290. In this case, when the display device is bent, the touch screen panel 250 of the display device may be damaged. On the other hand, when the groove region GR is formed in the display device, the NP2 at the bent portion of the display device may be formed within the touch screen panel 250. When the NP2 is formed within the touch screen panel 250, the touch screen panel 250 may not be damaged, so that the display device may be readily bent. A shape of the groove region GR once it is bent may have a semicircle shape.

The neutral plane may relate to a plane that is neither increased nor decreased in a cross-sectional size of the object when the object is bent. When the object comprises the same material, the neutral plane corresponds to a midplane of the object. However, when the object comprises a composite material which is composed of at least two materials, the neutral plane may be different from the midplane of the composite material.

When the groove region GR is not formed in the display device, the NP2 of the first adhesive 230, the touch screen panel 250, the second adhesive 270, and the transparent member 290 may be formed within the transparent member 290. In the display device according to example embodiments, the groove region GR may be formed in the display device so that a position of the NP2 is changed. For example, as the first adhesive 230, the second adhesive 270, and the transparent member 290 are removed at the bent portion of the display device, the groove region GR may be formed at the bent portion of the display device. The NP2 of the first adhesive 230, the touch screen panel 250, the second adhesive 270, and the transparent member 290 at the bent portion of the display device may be formed within the touch screen panel 250. Accordingly, the touch screen panel 250 is not damaged, and the display device may be readily bent.

The first and second adhesives 230 and 270, which are formed at the top and bottom portions of the touch screen panel 250 respectively, may have a low viscosity and a low adhesiveness. The touch screen panel 250 has mobility between first and second adhesives 230 and 270. Since the touch screen panel 250 has the mobility between first and second adhesives 230 and 270, damage of the touch screen panel 250 may be further prevented or substantially prevented while the display device is bent.

As described above, as the display device according to example embodiments includes the groove region GR at the bent portion of the display device, the display device may be bent without causing damage to the display panel 170, the touch screen panel 250, and the display device. In addition, when the display device is bent, one portion of the display panel 170 may be disposed at a front surface (e.g., the front) of the display device. Another portion of the display panel 170 may be disposed at a rear surface (e.g., the rear) of the display device. Accordingly, the display device may display an image at the front and rear surfaces.

The display device illustrated in the example embodiment of FIG. 3 includes the groove region GR which removes at least portions of the bottom member 210, the top member 190, and the transparent member 290 at the bent portion of the display device, but example embodiments are not limited thereto, and the display device may include the groove region GR which removes at least a portion of at least one of the bottom member 210, the top member 190, and the transparent member 290 at the bent portion of the display device. Furthermore, example embodiments are not limited to the number of grove regions and display panel regions as illustrated in the example embodiment of FIG. 3.

Figure 4:
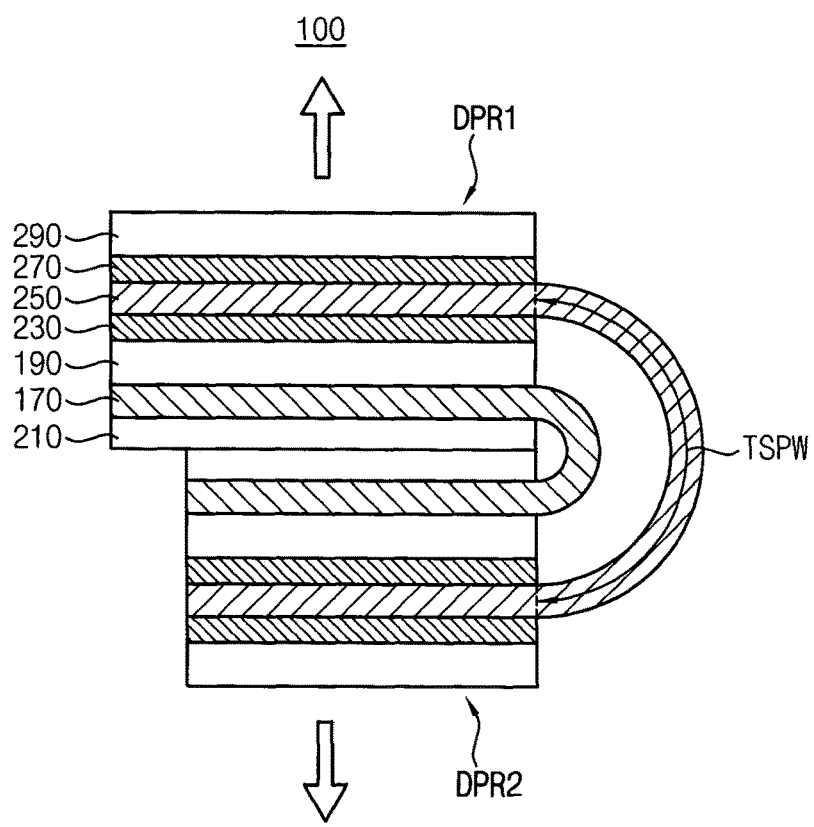
FIG. 4 is a cross-sectional view illustrating a display device according to example embodiments.

FIG. 4 is a cross-sectional view illustrating a display device 100 according to example embodiments. FIG. 5 is a perspective view illustrating a display device according to example embodiments. FIGS. 6A through 6F are cross-sectional views illustrating a method of manufacturing the display device according to example embodiments. A display device illustrated in FIGS. 4 through 6F may have a configuration substantially the same as or similar to that of the display device and the display panel described with reference to FIGS. 1 and 3, except a bending shape of a groove region GR. In FIGS. 4 through 6F, detailed descriptions for elements, which are substantially the same as or similar to the elements described with reference to FIGS. 1 and 3 may have been omitted.

Referring to FIGS. 4 and 5, as a display device 100 includes the groove region GR, the display device 100 may be bent. In addition, the display device 100 may display an image at a first surface (e.g., a front surface of the display device 100) and a second surface (e.g., a rear surface of the display device 100). As illustrated in FIGS. 4 and 5, the radius of the touch screen panel 250 can be greater than that of the display panel 170 in the groove region GR. That is, as the bending radius of the display device 100 is increased, a width of the touch screen panel 250 may be increased in the groove region GR. Accordingly, as the first adhesive 230 and the second adhesive 270 are disposed at the upper and lower portions, the touch screen panel 250 may have desired mobility. In particular, the touch screen panel 250 may be pushed in the groove region GR of the touch screen panel 250 according to the bending radius of the display device 100, or the touch screen panel 250 may be pushed out the groove region GR of the touch screen panel 250 according to the bending radius of the display device 100. When the display device 100 is bent, a damage of the touch screen panel 250 may be further prevented. As a result, the touch screen panel 250 may be bent with the display panel 170. In example embodiments, to block an emitted light in the groove regions, the display device may further include a shielding member, a case member, etc. which can cover or block the groove regions.

As described above, as the display device 100 according to example embodiments includes the groove region GR at a bent portion of the display device 100, the display device 100 may be bent without damage to the display panel 170, the touch screen panel 250, and the display device 100. In addition, when the display device 100 is bent, one portion of the display panel 170 may be disposed at a front surface of the display device 100. Another portion of the display panel 170 may be disposed at a rear surface of the display device 100. Accordingly, the display device 100 may display the image at the front and rear surfaces.

The display device illustrated in the example embodiments of FIGS. 4 and 5 includes the groove region GR which removes at least portions of the bottom member, the top member, and the transparent member at the bent portion of the display device, but example embodiments are not limited thereto, and the display device may include the groove region GR which removes at least a portion of at least one of the bottom member, the top member, and the transparent member at the bent portion of the display device. Furthermore, example embodiments are not limited to the number of grove regions and display panel regions as illustrated in the example embodiments of FIGS. 4 and 5.

Figure 6A:
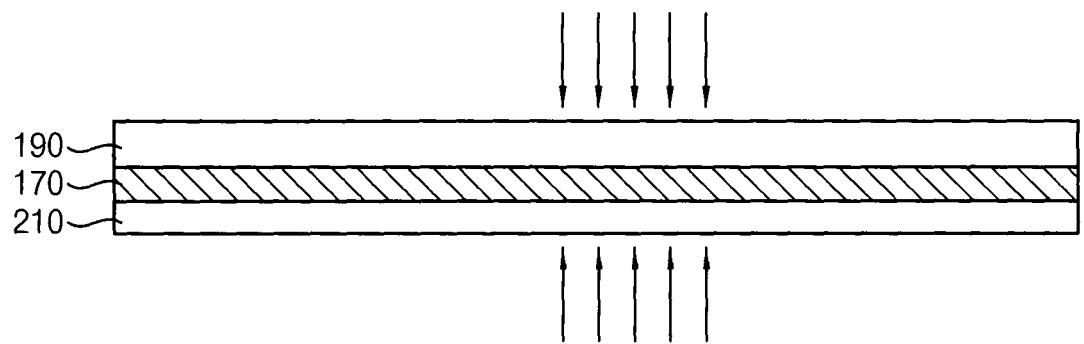
FIGS. 6A through 6F are cross-sectional views illustrating a method of manufacturing the display device according to example embodiments.

Referring to FIG. 6A, a top member 190 and a bottom member 210 may be formed on upper and lower portions of the display panel 170, respectively. A laser may be irradiated on at least one of the top member 190 and the bottom member 210. The bottom member 210 may include the bottom film PSA, the bottom film PET, etc. The bottom member 210 may protect a bottom substrate (e.g., a polyimide substrate) of the display panel 170.

The display panel 170 may be disposed on the bottom member 210. The display panel 170 may include the bottom substrate, a switching element, an anode electrode, an emission layer, a cathode electrode, an encapsulation unit, etc. The polyimide substrate may include a single polyimide layer or a plurality of polyimide layers. For example, the bottom substrate may include the polyimide substrate. The polyimide substrate may include a first polyimide layer, a barrier film layer, a second polyimide layer, etc. For example, the first polyimide layer is disposed on glass substrate, and the barrier film layer is disposed on the first polyimide layer. Also, the second polyimide layer may be disposed on the barrier film layer. After a buffer layer (e.g., an insulating layer) is disposed on the second polyimide layer, the switching element, the anode electrode, the emission layer, the cathode electrode, etc. may be disposed on the buffer layer. After the switching element, the anode electrode, the emission layer, the cathode electrode, etc., are disposed on the buffer layer, the glass substrate may be removed. The emission structures (e.g., the switching element, the anode electrode, the emission layer, the cathode electrode, etc.) may not be directly formed on the polyimide substrate because a thickness of the polyimide substrate is thin, and the polyimide substrate has desired mobility. Thus, after the emission structures are formed using (or utilizing) the glass substrate of the rigid materials, the glass substrate is removed. In this case, the polyimide layers may be used as a substrate.

The switching element may be disposed on the bottom substrate. The switching element may control emission of the light. In example embodiments, the switching element may correspond to a semiconductor element including an active layer, which is formed as an oxide semiconductor, an inorganic semiconductor (e.g., an amorphous silicon, a poly silicon), an organic semiconductor, etc. The switching element may be electrically coupled (e.g., electrically connected) to the anode electrode. The anode electrode and the cathode electrode may include metal, alloy, metallic nitride, conductive metal oxide, a transparent conductive material, etc. For example, the anode electrode and the cathode electrode may include the Al, aluminum alloy, the AlNx, the Ag, silver alloy, the W, the WNx, the Cu, the Ni, the Cr, the CrNx, the Mo, the molybdenum alloy, the Ti, the TiNx, the Pt, the Ta, the TaNx, the Nd, the Sc, the SRO, the ZnOx, the ITO, the SnOx, the InOx, the GaOx, the IZO, etc. These may be used (or utilized) alone or in a combination thereof.

The emission layer may be disposed between the anode electrode and the cathode electrode. The emission layer may include the EML, the HIL, the HTL, the ETL, the EIL, etc. The EML of the emission layer may include light emitting materials capable of generating different colors of light, such as a red color of light, a blue color of light, and/or a green color of light according to the kinds of pixels included in the display device. In some example embodiments, the EML of the emission layer may generally generate a white color of light by stacking a plurality of light emitting materials capable of generating different colors of light, such as a red color of light, a green color of light, a blue color of light, etc.

The encapsulation unit may be disposed on the cathode electrode, and the encapsulation unit may be positioned opposite to the bottom substrate. The encapsulation unit may include a flexible material. For example, the encapsulation unit may include a stacked structure where at least one organic layer and at least one inorganic layer are alternately stacked. For example, the inorganic layer may include silicon oxide, silicon nitride, silicon oxynitride, silicon oxycarbide, silicon carbonitride, aluminium oxide, aluminium nitride, titanium oxide, zinc oxide, etc. The organic layer may include acrylate monomer, phenylacetylene, diamine, dianhydride, siloxane, silane, parylene, the olefin-based polymer, polyethylene terephthalate, fluorine resin, polysiloxane, etc. As described above, the encapsulation unit including the stacked structure and the polyimide substrate may improve the flexibility of the display device. For example, the polyimide substrate may improve the flexibility of the display device. The switching element, the anode electrode, and the cathode electrode of the display panel 170 may be obtained according to suitable manufacturing processes.

The top member 190 may include the polarizer which is formed as polyvinylalcohol-based resin film, or the like. In example embodiments, the polarizer may include a linearly polarized layer and a $\lambda/4$ phase retardation layer. Here, the linear polarization layer is disposed on the $\lambda/4$ phase retardation layer. The polarizer of the top member 190 may be formed according to general manufacturing processes.

Figure 6B:
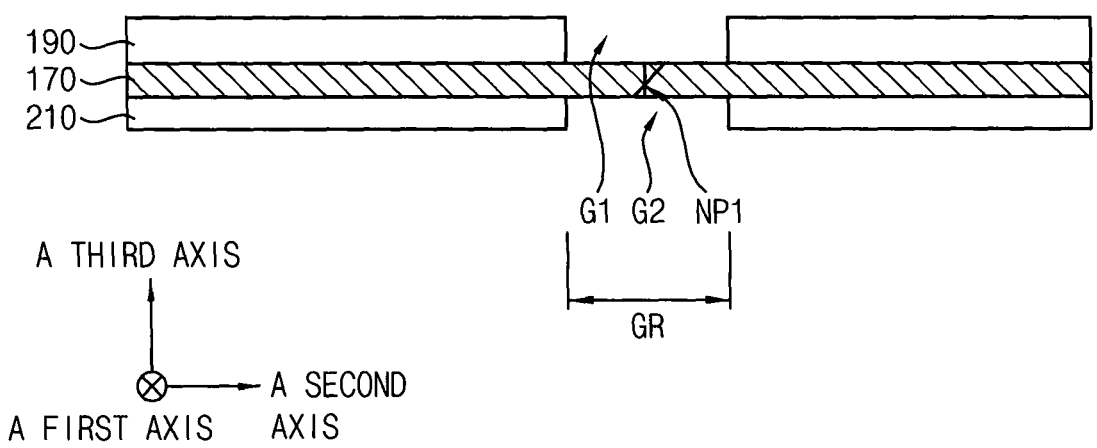

Referring to FIG. 6B, a recess which is formed at the bottom member 210 by a laser irradiation is defined as a second groove G2. The laser may use (or utilize) a CO2 laser source having high energy efficiency. In example embodiments, the laser irradiation may be performed in a multi scan method according to the width of the groove region GR. For example, when the width (e.g., desired width) of the groove region GR is greater than a width of the irradiated laser, the laser may be repeatedly irradiated along the second axis (or first axis) direction to form the groove region GR having the width. At the bent portion of the display device, at least a portion of the bottom member 210 may be removed by a laser, or the bottom member 210 may be completely removed by a laser at the bent portion. For example, a depth of the second groove G2 in a third axis direction may be about 20 Å to about 100 Å.

In some example embodiments, the display panel 170 may include a recess which removes at least a portion of at least one of the encapsulation unit and the bottom substrate of the display panel 170 at the bent portion of the display device. Here, the recess which is formed at the bottom substrate may include the barrier film layer and the first polyimide layer, except the second polyimide layer. In addition, a recess which is formed at the top member 190 by a laser irradiation is defined as a first groove G1. For example, the first groove G1 may be formed by a laser irradiation. The laser may use (or utilize) a CO2 laser source having the high energy efficiency. In example embodiments, the laser irradiation may be performed in a multi scan method according to the width of the groove region GR. For example, when the width of the groove region GR is greater than a width of the irradiated laser, the laser may be repeatedly irradiated along the second axis (or first axis) direction to form the groove region GR having the width. At the bent portion of the display device, at least a portion of the top member 190 may be removed by a laser, or the top member 190 may be completely removed by a laser at the bent portion. For example, a depth of the first groove G1 in the third axis direction may be formed by removing about 10% to about 100% of a thickness of the top member 190. Here, the depth and the width of the groove region GR may be determined according to the bending degree (e.g., a bending radius). When the depth is determined to be about 10% of the thickness of the top member 190, the bending radius may be small (e.g., a shape of the display panel 170 may have a gradually curved surface in the groove region GR). In addition, when the depth is determined to be about 100% of the thickness of the top member 190, the bending radius may be large (e.g., a shape of the display panel 170 may have a semicircle shape in the groove region GR).

When the groove region GR is formed in the display device, the NP1 which is positioned in the groove region GR may be formed within the display panel 170.

Figure 6C:
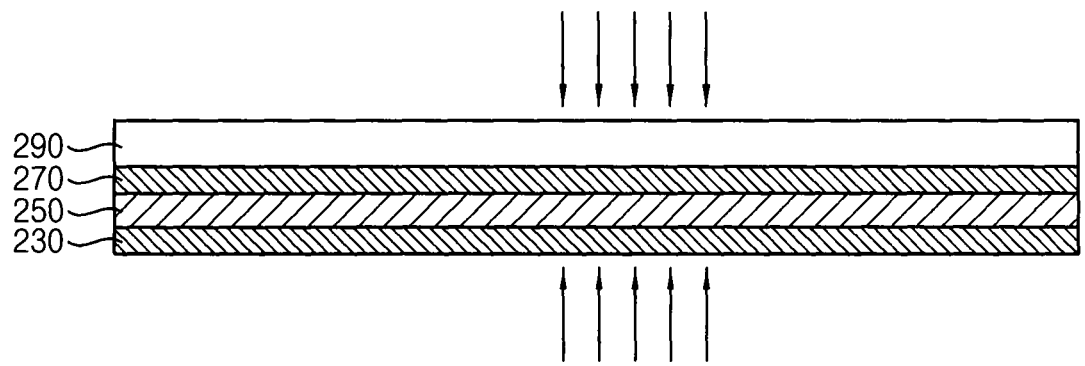

Referring to FIG. 6C, the first and second adhesives 230 and 270 are formed on the upper and lower portions of the touch screen panel 250, respectively. The transparent member 290 may be formed on the second adhesive 270. A laser may be irradiated on at least one of the first adhesive 230, the second adhesive 270, and the transparent member 290. The first adhesive 230 may adhere to the top member 190 and the touch screen panel 250. The second adhesive 270 may adhere to the touch screen panel 250 and the transparent member 290. In example embodiments, the first adhesive 230 and the second adhesive 270 may include urethane-based materials, acryl-based materials, silicon-based materials, etc. However, the first adhesive 230 and the second adhesive 270 may have a low viscosity and a low adhesiveness so that the touch screen panel 250 has the mobility between the first adhesive 230 and the second adhesive 270. When the groove region GR is formed in the transparent member 290, the transparent member 290 may include transparent plastic materials. For example, the transparent member 290 may be formed as a plastic window. Here, the plastic window may include a plastic having transparency of above about 95%. The touch screen panel 250 may include a bottom PET film, touch screen panel electrodes, and a top PET film. The first adhesive 230, the second adhesive 270, the touch screen panel 250, and transparent member 290 may be formed according to suitable manufacturing processes.

Figure 6D:
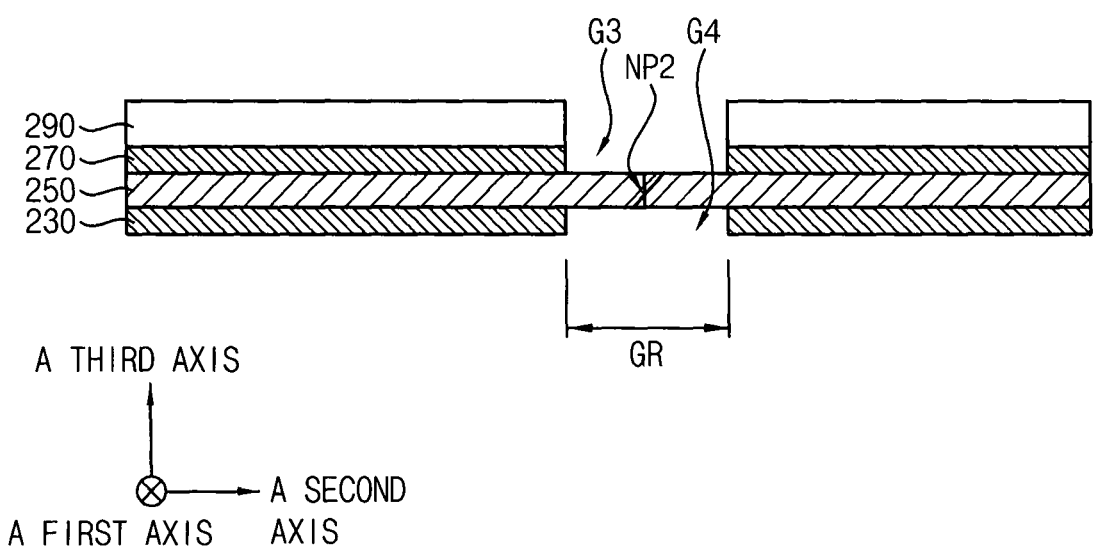

Referring to FIG. 6D, a recess which is formed at the first adhesive 230 by a laser irradiation is defined as a fourth groove G4. The fourth groove G4 may be formed by a laser irradiation. For example, the laser may use (or utilize) a CO2 laser source which has the high energy efficiency. The laser irradiation may be irradiated as multi scan methods according to the width (e.g., desired width) of the groove region GR in the second axis direction. In addition, a recess which is formed at the second adhesive 270 and the transparent member 290 by a laser irradiation is defined as a third groove G3. However, when the fourth groove G4 is formed by a laser irradiation, the fourth groove G4 may include at least a portion of the bottom PET film of the touch screen panel 250. Also, when the third groove G3 is formed by a laser irradiation, the third groove G3 may include at least a portion of the top PET film of the touch screen panel 250. When the groove region GR is formed in the display device, the NP2 at the bent portion of the display device may be formed within the touch screen panel 250.

Figure 6E:
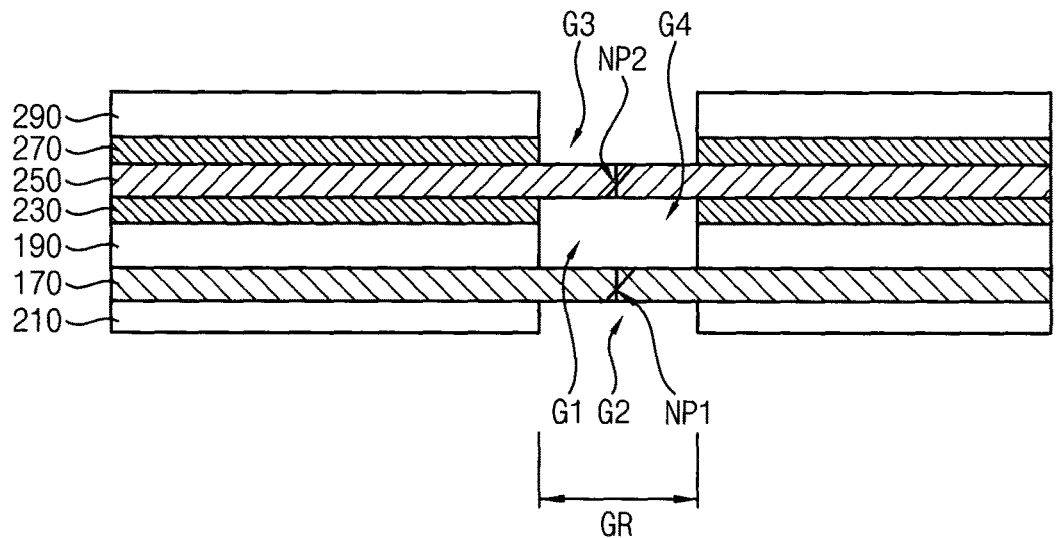
Figure 6F:
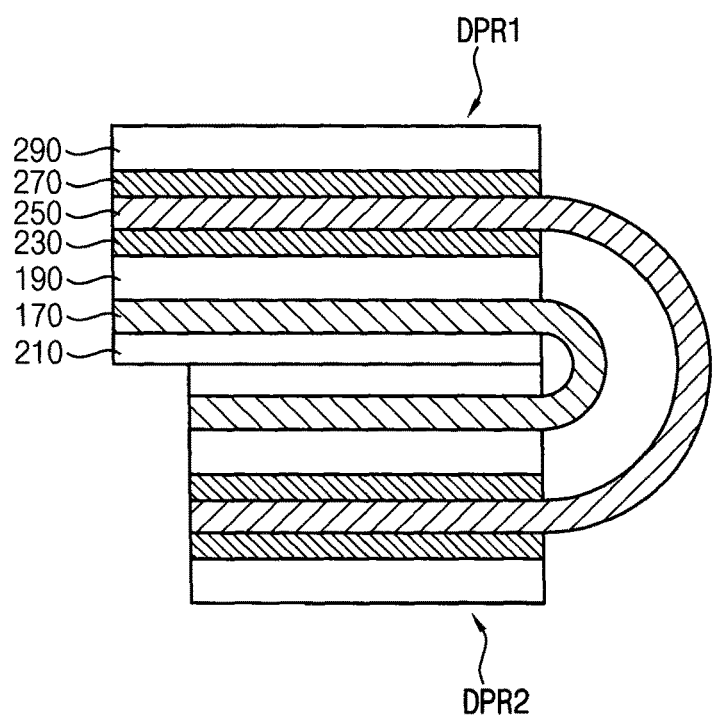

Referring to FIGS. 6E and 6F, the touch screen panel 250, the first adhesive 230, the second adhesive 270, and the transparent member 290 may be formed on the display panel 170, the bottom member 210, and the top member 190.

When the display device having the members is bent, the display device is not damaged because the touch screen panel 250 may have the mobility between the first adhesive 230 and the second adhesive 270. The display device may be bent. In example embodiments, to block or substantially block an emitted light from the groove region, the display device may further include a shielding member, a case member, etc. that covers or blocks the groove regions.

As described above, as the display device according to example embodiments includes the groove region GR at the bent portion of the display device 100, the display device may be bent without a damage of the display panel 170, the touch screen panel 250, and the display device. In addition, when the display device is bent, one portion of the display panel 170 may be disposed at a front surface of the display device, and another portion of the display panel 170 may be disposed at a rear surface of the display device. Accordingly, the display device may display an image at the front and rear surfaces. In some example embodiments, when the transparent member 290 includes a glass, or the like, a processed transparent member 290 may be individually formed on the display panel 170 after the display panel 170 is bent.

Figure 7:
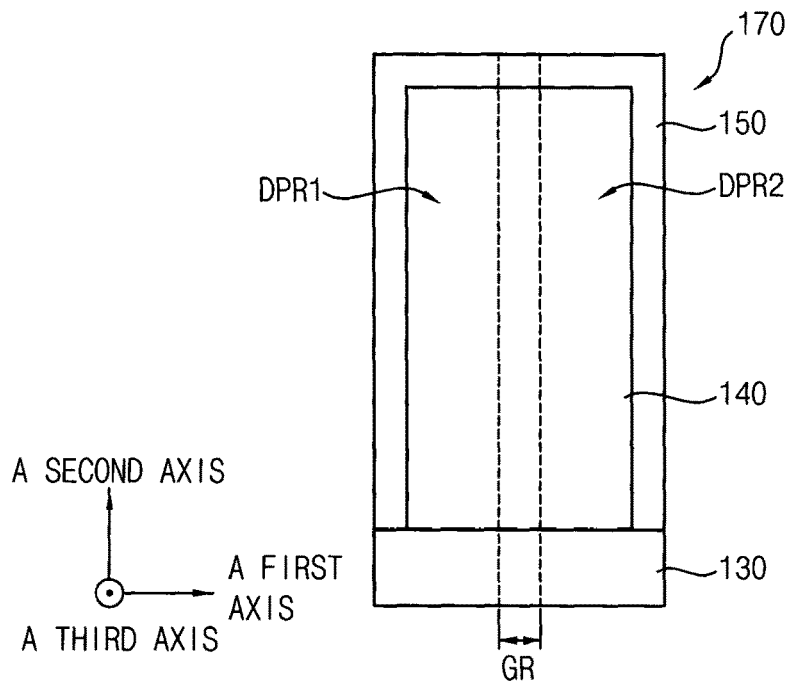
FIG. 7 is a plan view illustrating a display panel before being bent according to example embodiments.

FIG. 7 is a plan view illustrating a display panel before being bent according to example embodiments. A display panel illustrated in FIG. 7 may have a configuration substantially the same as or similar to that of the display device and the display panel described with reference to FIGS. 1 and 3, except a shape of a groove region GR where the display panel is divided in a second axis direction. In FIG. 7, detailed descriptions for elements, which are substantially the same as or similar to the elements described with reference to FIGS. 1 and 3 may have been omitted.

Referring to FIG. 7, the groove region GR may divide the display panel 170 into two display panel regions. For example, the display panel 170 may include a first display panel region DPR1 and a second display panel region DPR2. Here, the groove region GR may be formed between the first display panel region DPR1 and the second display panel region DPR2 along a second axis direction. That is, the display panel 170 may be divided into the first display panel region DPR1 and the second display panel region DPR2 by the groove region. For example, the groove region GR may be formed by removing at least a portion of an additional structure (e.g., a bottom member, a top member, an adhesive, a touch screen panel, a transparent member, etc.) formed on a top surface and/or a bottom surface of the display panel 170.

When the display panel 170 is bent at the groove region GR along the second axis direction, the first display panel region DPR1 may display an image at a first surface (e.g., a front surface) of the display device, and the second display panel region DPR2 may display the image at a second surface which is opposite to the first surface (e.g., a rear surface) of the display device. A width of the groove region GR in the first axis direction may be determined depending on a bending radius (e.g., a folding radius) of the display panel 170. In addition, the groove region GR may be formed by a laser irradiation. For example, the laser may use (or utilize) a CO2 laser source which has the high energy efficiency. The laser irradiation may be irradiated as the single scan or multi scan methods according to the width (e.g., desired width) of the groove region GR in the first axis direction. For example, when the width of the groove region GR is greater than a width of the irradiated laser, the laser may be repeatedly irradiated along the first axis (or second axis) direction to form the groove region GR having the width.

When the display panel 170 is bent at the groove region GR along the second axis direction which is perpendicular to the first axis direction, the pad unit 130 may be damaged. Accordingly, when the groove region GR is formed in the second axis direction of the display panel 170, chip on film (COF), chip on glass (COG), flexible printed circuit board (FPCB), etc., of the pad unit 130 may be disposed at the left or right side portions of the pad unit 130. As the COF, the COG, the FPCB, etc., are disposed at the left or right side portions of the pad unit 130, the pad unit 130 may not be damaged even though the display panel 170 is bent at the groove region GR along the second axis direction. In example embodiments, to block or substantially block an emitted light from the groove regions, the display device may further include a shielding member, a case member, etc., which can cover or block the groove regions.

As described above, as the display device having the additional structures at the top and bottom portions of the display panel 170 according to example embodiments includes the groove region GR at a bent portion of the display device, the display device may be bent without causing damage to the display panel 170, the touch screen panel 250, and the display device. In addition, one portion of the display panel 170 may be disposed at a front surface of the display device, and another portion of the display panel 170 may be disposed at a rear surface of the display device 100. Accordingly, the display device may display the image at the front and rear surfaces.

Figure 8:
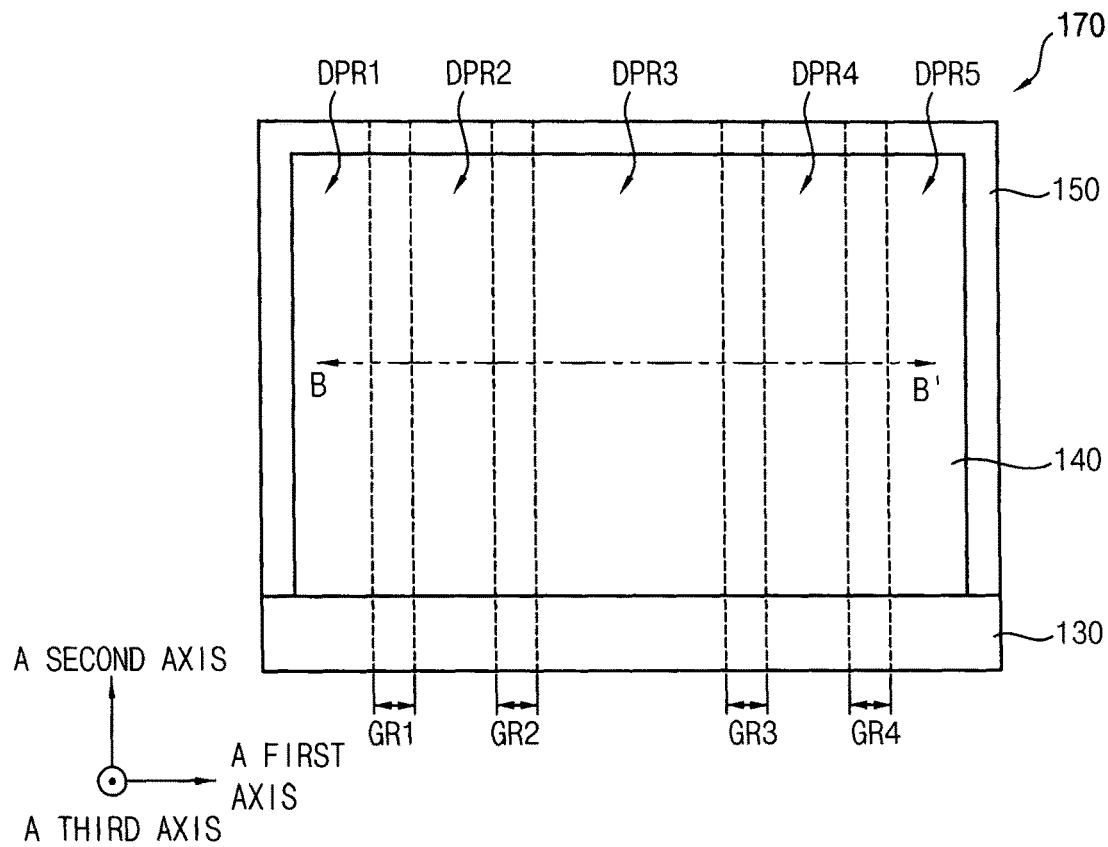
FIG. 8 is a plan view illustrating a display panel before being bent according to example embodiments.
Figure 9:
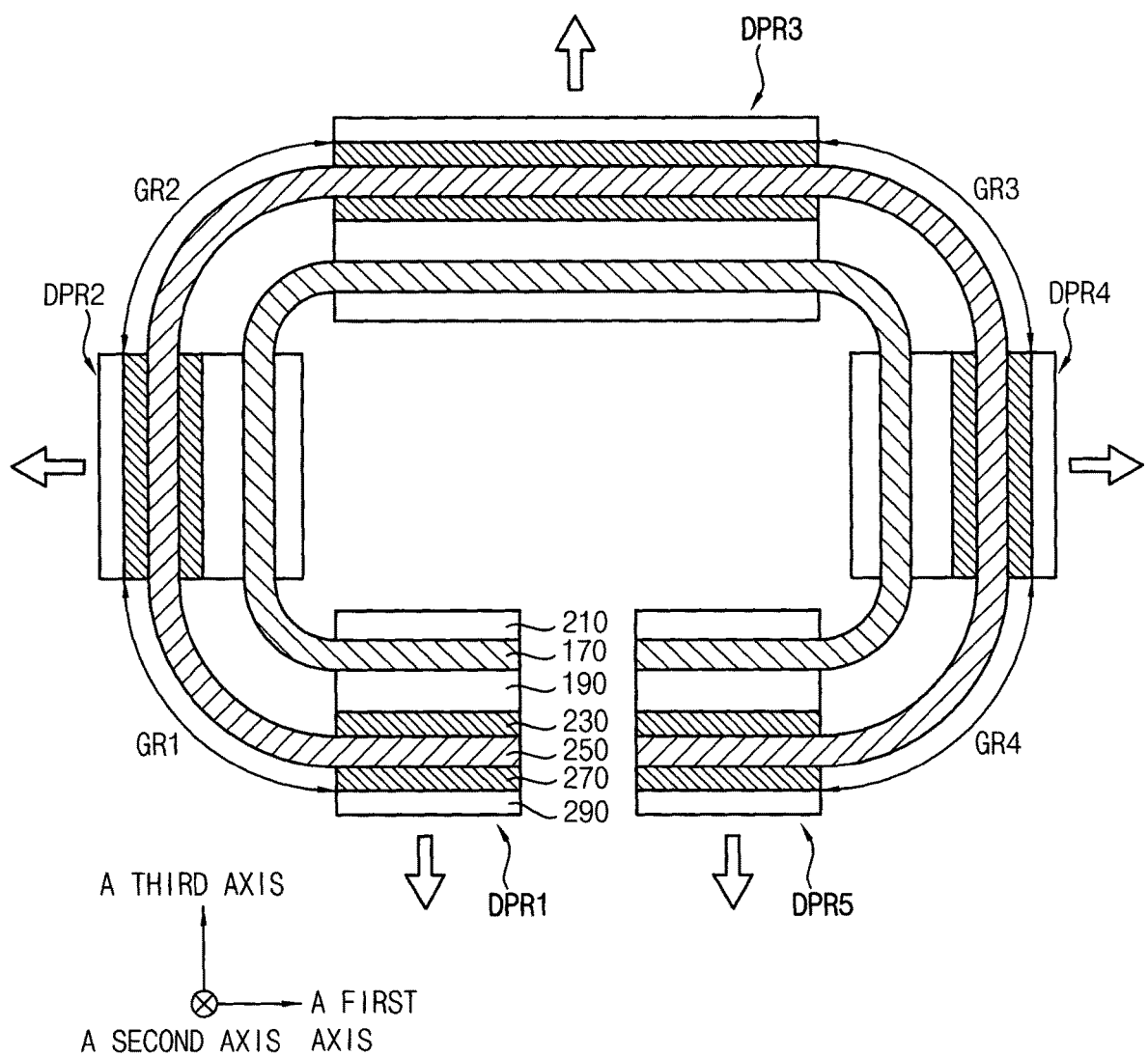
FIG. 9 is a cross-sectional view taken along the line B-B' of FIG. 8, illustrating the display device according to example embodiments.

FIG. 8 is a plan view illustrating a display panel before being bent according to example embodiments. FIG. 9 is a cross-sectional view taken along the line B-B' of FIG. 8, illustrating the display device according to example embodiments. A display panel and display device illustrated in FIGS. 8 and 9 may have a configuration substantially the same as or similar to that of the display device and the display panel described with reference to FIGS. 1 and 3, except a shape of the first through fourth groove regions GR1, GR2, GR3, and GR4 that divides the display panel and display device in a second axis direction. In FIGS. 8 and 9, detailed descriptions for elements, which are substantially the same as or similar to the elements described with reference to FIGS. 1 and 3 may have been omitted.

Referring to FIG. 8, the first through fourth groove regions GR1, GR2, GR3, and GR4 may divide the display panel 170 into five display panel regions. For example, the display panel 170 may include first through fifth display panel regions DPR1, DPR2, DPR3, DPR4, and DPR5. Here, the first groove region GR1 may be formed between the first display panel region DPR1 and the second display panel region DPR2 along a second axis direction. The second groove region GR2 may be formed between the second display panel region DPR2 and the third display panel region DPR3 along the second axis direction. The third groove region GR3 may be formed between the third display panel region DPR3 and the fourth display panel region DPR4 along the second axis direction. The fourth groove region GR4 may be formed between the fourth display panel region DPR4 and the fifth display panel region DPR5 along the second axis direction. For example, the first to fourth groove regions GR1 to GR4 may be formed by removing at least a portion of an additional structure (e.g., a bottom member, a top member, an adhesive, a touch screen panel, a transparent member, etc.) formed on a top surface and a bottom surface of the display panel 170.

Widths of the groove regions GR1 to GR4 in the first axis direction may be determined depending on a bending radius of the display panel 170. The groove regions GR1 to GR4 may be formed by a laser irradiation. For example, the laser may use (or utilize) a CO2 laser source having high energy efficiency. In example embodiments, the laser irradiation may be performed in single scan or multi scan methods according to the widths (e.g., desired widths) of the groove regions GR1 to GR4. For example, when the width of the first groove region GR1 in the first axis direction is greater than a width of the irradiated laser, the laser may be repeatedly irradiated along the first axis (or second axis) direction to form the first groove region GR1 having the width.

When the display panel 170 is bent at the first through fourth groove regions GR1, GR2, GR3, and GR4 along the second axis direction, the pad unit 130 may be damaged. Accordingly, when the groove region GR is formed in the second axis direction of the display panel 170, the COF, the COG, the FPCB, etc. of the pad unit 130 may be disposed at the left or right side portions of the pad unit 130. As the COF, the COG, the FPCB, etc. are disposed at the left or right side portions of the pad unit 130, the pad unit 130 may not be damaged even though the display panel 170 is bent at the groove regions along the vertical axis (e.g., second axis).

Referring to FIG. 9, the first through fourth groove regions GR1, GR2, GR3, and GR4 of the display device may be bent at about 90 degrees. When the display device is bent at the first through fourth groove regions GR1, GR2, GR3, and GR4 along the second axis direction, the third display panel region DPR3, which is disposed between the second groove region GR2 and the third groove region GR3, may be positioned at the front. Here, the second display panel region DPR2, which is disposed between the first groove region GR1 and the second groove region GR2, may be positioned at the left. In addition, the fourth display panel region DPR4, which is disposed between the third groove region GR3 and the fourth groove region GR4, may be positioned at the right. Further, the first display panel region DPR1, which is disposed at the left of the first groove region GR1, and the fifth display panel region DPR5, which is disposed at the right of the fourth groove region GR4, may be positioned at the rear. Thus, the display device may display an image at the left, the right, the front, and the rear. In example embodiments, to block or substantially block an emitted light in the groove regions, the display device may further include a shielding member, a case member, etc., which can cover or block the groove regions.

When the display device 100 including the first through fourth groove regions GR1, GR2, GR3, and GR4 is bent, the display device may not be damaged. Thus, the display device that can display an image at the left, the right, the front, and the rear may be implemented.

As described above, as the display device according to example embodiments includes the first through fourth groove regions GR1, GR2, GR3, and GR4 at bent portions of the display device, the display device may be bent without causing damage to the display panel 170, the touch screen panel 250, and the display device. In addition, when the display device is bent, one portion of the display panel 170 may be disposed at a front surface (e.g., DPR3) of the display device, and another portion of the display panel 170 may be disposed at a rear surface (e.g., DPR1 and DPR5) of the display device. Still another portion of the display panel 170 may be disposed at both side surfaces (e.g., DPR2 and DPR4) of the display device. Accordingly, the display device may display an image at the front, rear, and both side surfaces.

The display device illustrated in the example embodiments of FIGS. 8 and 9 includes the groove regions GR1 to GR4, which removes at least portions of the bottom member, the top member, and the transparent member at bent portions of the display device, but example embodiments are not limited thereto, and the display device may include the groove regions GR1 to GR4 which removes at least a portion of at least one of the bottom member, the top member, and the transparent member at the bent portions of the display device. Furthermore, example embodiments are not limited to the number of grove regions and display panel regions as illustrated in the example embodiments of FIGS. 8 and 9.

Figure 10:
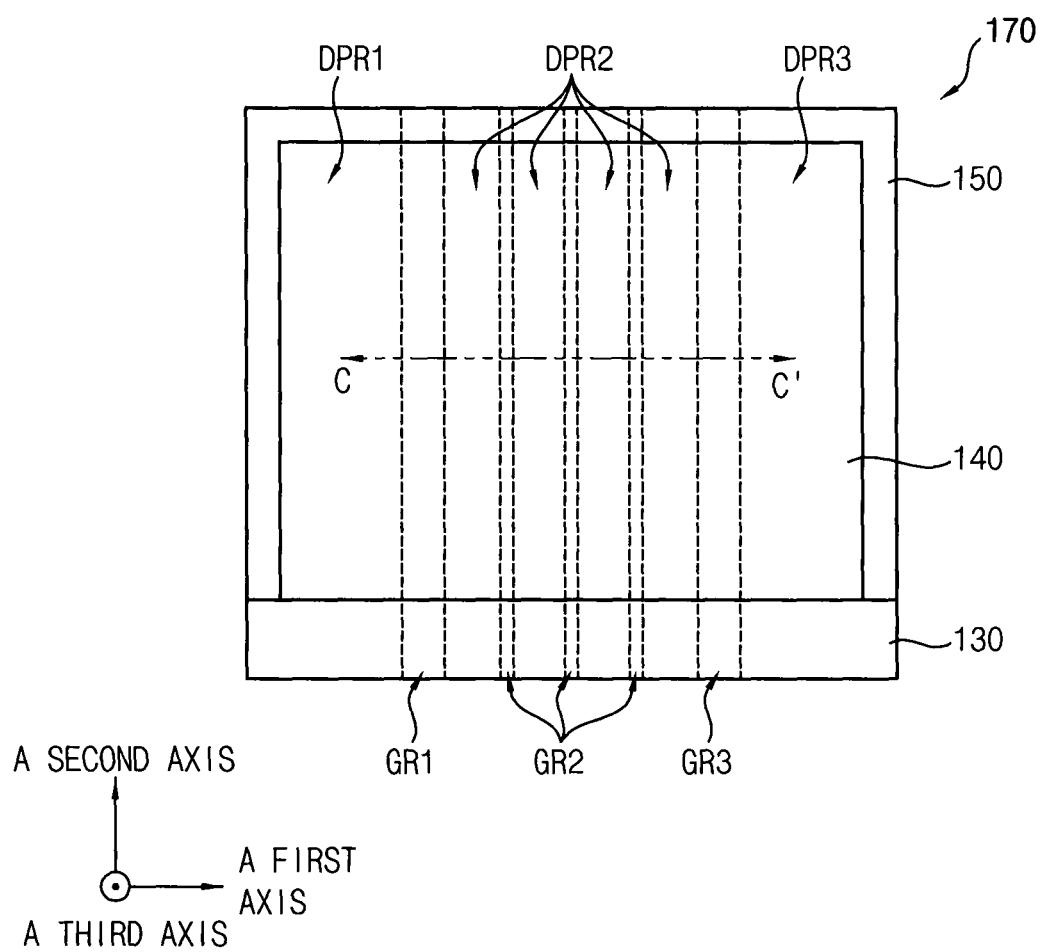
FIG. 10 is a plan view illustrating a display panel before being bent according to example embodiments.
Figure 11:
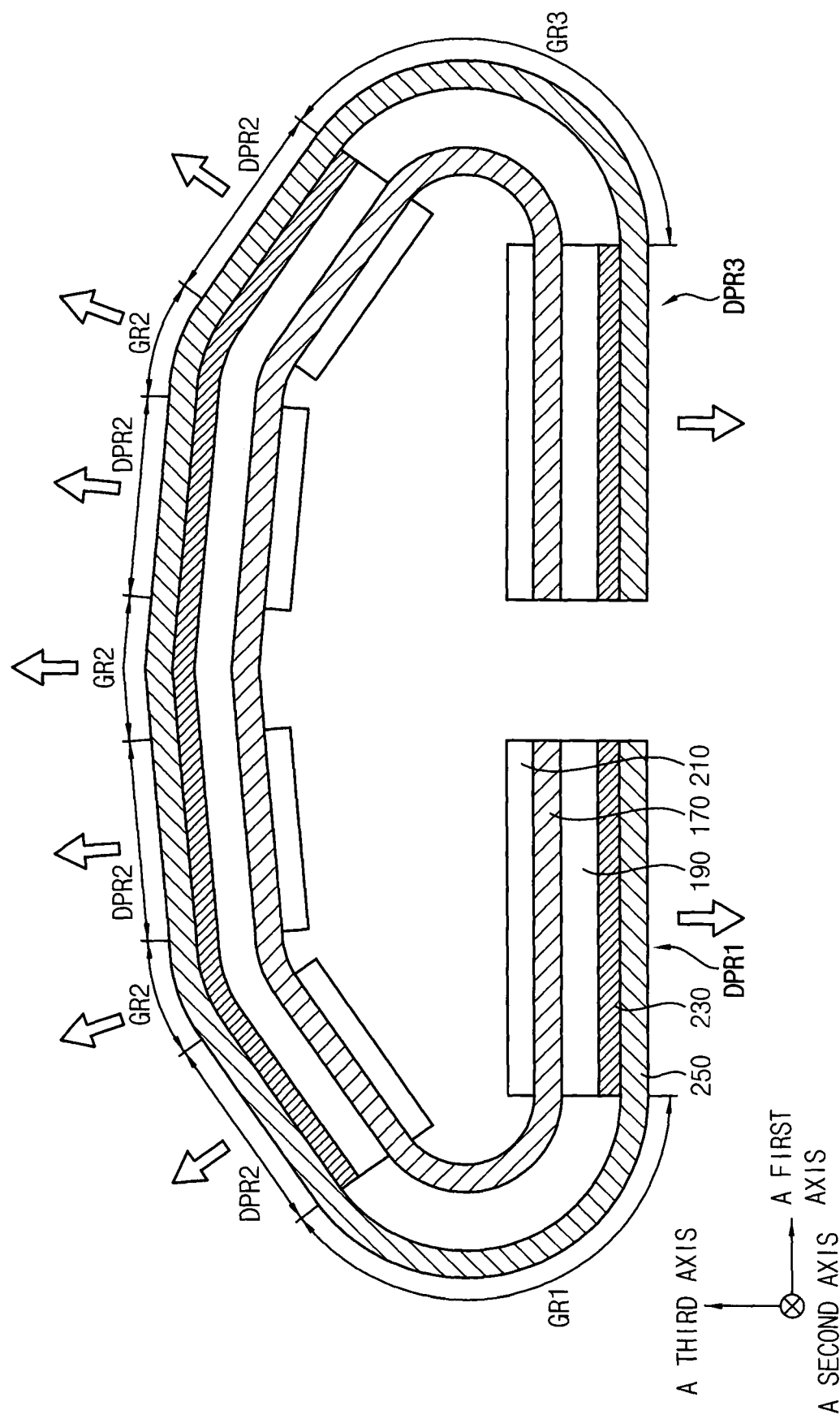
FIG. 11 is a cross-sectional view taken along the line C-C' of FIG. 10, illustrating the display device according to example embodiments.

FIG. 10 is a plan view illustrating a display panel before being bent according to example embodiments. FIG. 11 is a cross-sectional view taken along the line C-C' of FIG. 10, illustrating the display device according to example embodiments. A display panel and display device illustrated in FIGS. 10 and 11 may have a configuration substantially the same as or similar to that of the display device and the display panel described with reference to FIGS. 1 and 3, except a shape of the first through third groove regions GR1, GR2, and GR3 that divides the display panel and display device in a second axis direction. In FIGS. 10 and 11, detailed descriptions for elements, which are substantially the same as or similar to the elements described with reference to FIGS. 1 and 3 may have been omitted.

Referring to FIG. 10, the first through third groove regions GR1, GR2, and GR3 may divide the display panel 170 into three display panel regions. For example, the display panel 170 may include the first through third display panel regions DPR1, DPR2, and DPR3. Here, the first groove region GR1 may be formed between the first display panel region DPR1 and the second display panel region DPR2 along a second axis direction. The third groove region GR3 may be formed between the second display panel region DPR2 and the third display panel region DPR3 along a second axis direction. Three second groove regions GR2 may be formed between four of the second display panel regions DPR2 (e.g., sub-display panel regions of DPR2) along a second axis direction. For example, the groove regions GR1 to GR3 may be formed by removing at least a portion of an additional structure (e.g., a bottom member, a top member, an adhesive, a touch screen panel, a transparent member, etc.) formed on a top surface and/or a bottom surface of the display panel 170.

Widths of the groove regions GR1 to GR3 in the first axis direction may be determined depending on a bending radius of the display panel 170. The groove regions GR1 to GR3 may be formed by a laser irradiation. For example, the laser may use (or utilize) a CO2 laser source having high energy efficiency. In example embodiments, the laser irradiation may be performed in the single scan or multi scan methods according to the widths (e.g., desired widths) of the groove regions GR1 to GR3. For example, when the width of the groove region GR1 is greater than a width of the irradiated laser, the laser may be repeatedly irradiated along the first axis (or second axis) direction to form the groove region GR1 having the width.

When the display panel 170 is bent at the first through third groove regions GR1, GR2, and GR3 along the second axis direction, the pad unit 130 may be damaged. Accordingly, when the groove regions GR1 to GR3 are formed in the second axis direction of the display panel 170, the COF, the COG, the FPCB, etc., of the pad unit 130 may be disposed at the left or right side portions of the pad unit 130. As the COF, the COG, the FPCB, etc., are disposed at the left or right side portions of the pad unit 130, the pad unit 130 may not be damaged even though the display panel 170 is bent at the groove regions along the vertical axis (e.g., second axis).

Referring to FIG. 11, the first through third groove regions GR1, GR2, and GR3 of the display device may be bent. When the display device is bent at the first through third groove regions GR1, GR2, and GR3 along the second axis direction, the second display panel regions DPR2 (e.g., a curved display panel region) which is disposed between the first and third groove regions GR1 and GR3 have the curved shape by the second groove regions GR2, and the second panel regions DPR2 (e.g., sub-panel regions) may be positioned along a first surface (e.g., the front). For example, the second groove region GR2 is formed as a plurality of groove regions, and the groove regions are spaced apart from each other by a distance (e.g., predetermined distance) at the curved display panel region. The first display panel region DPR1, which is disposed at the left of the first groove region GR1, and the third display panel region DPR3, which is disposed at the right of the third groove region GR3, may be positioned along a second surface (e.g., the rear). In addition, the second display panel regions DPR2, which is disposed between the first groove region GR1 and the third groove region GR3, may display an image from the first surface of the display device. The first display panel region DPR1, which is disposed at the left of the first groove region GR1, and the third display panel region DPR3, which is disposed at the right of the third groove region GR3, may display the image from the second surface of the display device. Here, as illustrated in FIG. 11, the bending width of the second groove regions GR2 in the first axis direction may be less than that of the first and third groove regions in the first axis direction. For example, when a plurality of the groove regions, which have a small bending width in the first axis direction such as the second groove regions GR2, are disposed between the first and third groove regions, the curved display panel region may include the smooth curved shape. However, when the display device has the transparent member 290, the transparent member 290 should include the first through third groove regions GR1, GR2, and GR3. In this case, a grip feeling of the display device may be decreased by the first through third groove regions GR1, GR2, and GR3 of the transparent member 290. Thus, the display device may further include a transparent member of glass-based materials. Here, the transparent member may be disposed on the touch screen panel 250, and may have a curved shape. In example embodiments, to block or substantially block an emitted light in the first and third groove regions GR1 and GR3, the display device may further include a shielding member, a case member, etc. which can cover or block the first and third groove regions GR1 and GR3. In one example embodiment, the second groove regions GR2 may be formed only at the bottom member 210 (e.g., the grooves are not formed in the top member 190 and the first adhesive 230 of the second groove regions GR2). Since the bending angle of the second groove regions GR2 is very small (e.g., the bending width is very small), the top member 190 and the first adhesive 230 may not be removed. For example, since the top member 190 and the first adhesive 230 are not damaged in set or predetermined bending angles, the top member 190 and the first adhesive 230 may be bent. In addition, when comparing the emitted light in the second groove regions GR2 with the emitted light in the second display panel regions DPR2, the emitted light in the second groove regions GR2 may be substantially identical with the emitted light in the second display panel regions DPR2, because the bending angle of the second groove regions GR2 is very small. Thus, the shielding member, the case member, etc. may not be disposed on the second groove regions GR2.

In another example embodiment, to block or substantially block an emitted light in the first and third groove regions GR1 and GR3, the display device may further include a shielding member, a case member, etc. which can cover or block the first and third groove regions GR1 and GR3. The first and third groove regions GR1 and GR3 may be formed in the bottom member 210 and the top member 190.

In another example embodiment, to block an emitted light in the first and third groove regions GR1 and GR3, the display device may further include a shielding member, a case member, etc. which can cover or block the first and third groove regions GR1 and GR3. The first and third groove regions GR1 and GR3 may be formed in the top member 190.

As described above, as the display device according to example embodiments includes the first through third groove regions GR1, GR2, and GR3 at bent portions of the display device, the display device may be bent without causing damage to the display panel 170, the touch screen panel 250, and the display device. In addition, when the display device is bent, one portion of the display panel 170 may be disposed at a front surface of the display device, and another portion of the display panel 170 may be disposed at a rear surface of the display device. Accordingly, the display device may display the image at the front and rear surfaces. However, example embodiments are not limited to the number of grove regions and display panel regions as illustrated in the example embodiments of FIGS. 10 and 11.

Figure 12:
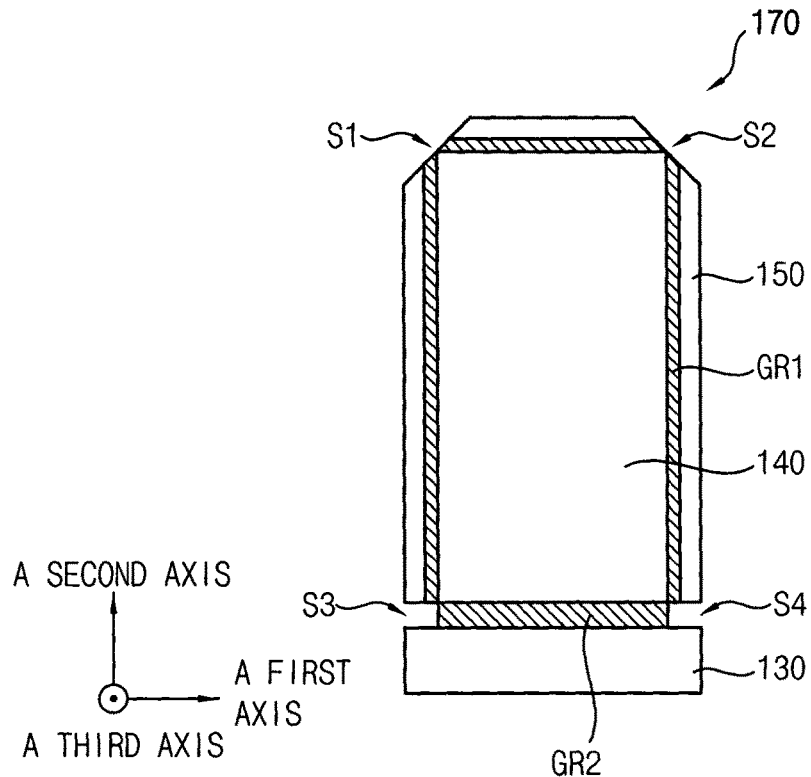
FIG. 12 is a plan view illustrating a display panel according to example embodiments.
Figure 13A:
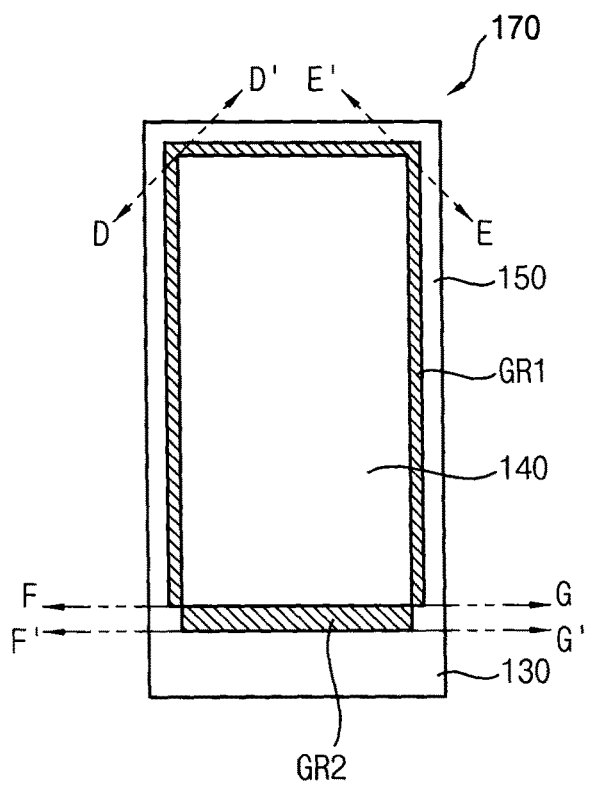
FIGS. 13A through 13C are plan views illustrating a method of removing a peripheral region in the display panel of FIG. 12.
Figure 13B:
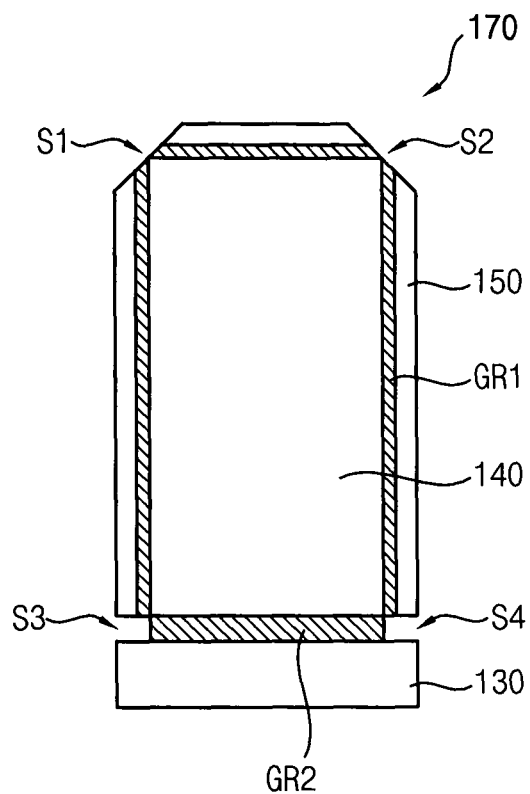
Figure 13C:
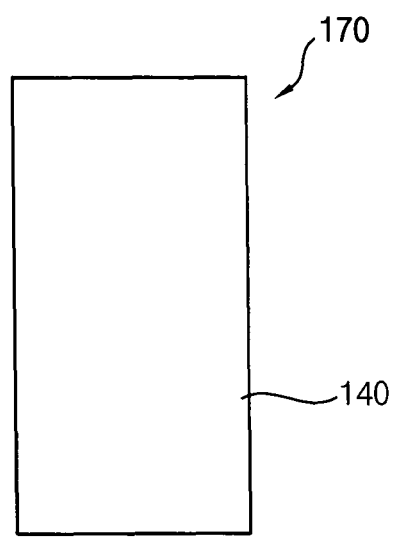

FIG. 12 is a plan view illustrating a display panel according to example embodiments. FIGS. 13A through 13C are plan views illustrating a method of removing a peripheral region in the display panel of FIG. 12. A display panel illustrated in FIGS. 12 through 13C may have a configuration substantially the same as or similar to that of the display panel described with reference to FIG. 1, except a bending shape of a groove region GR. In FIGS. 12 through 13C, detailed descriptions for elements, which are substantially the same as or similar to the elements described with reference to FIG. 1 may have been omitted.

Referring to FIG. 12, a display panel 170 may include a display unit 140, a pad unit 130, a peripheral unit 150, a groove regions GR1 and GR2, a first cutting region S1, a second cutting region S2, a third cutting region S3, and a fourth cutting region S4. For example, the groove regions GR1 and GR2 may be formed by removing at least a portion of an additional structure (e.g., a bottom member, a top member, an adhesive, a touch screen panel, a transparent member, etc.) formed on a top surface and/or a bottom surface of the display panel 170. Thus, the transparent member, the touch screen panel, the polarizer, the bottom film, etc. may be additionally formed on an upper surface (e.g., in a third axis direction) of the display panel 170 or a lower surface (e.g., in a direction opposite to the third axis direction).

When each of the peripheral units 150, which are positioned at top, left, and right portions of the display unit 140, are bent, the peripheral units 150 may not be overlapped with each other by the first cutting region S1 and the second cutting region S2, respectively. Thus, the peripheral units 150 may be readily bent.

After the peripheral units 150, which are positioned at the left and right portions of the display unit 140, are bent, the pad unit 130 may be bent. That is, when the peripheral units 150, which are positioned at the left and right portions of the display unit 140, are bent along a second axis direction, the pad unit 130 may be disposed on a lower surface of the peripheral units 150, which are positioned at the left and right portions of the display unit 140. The width of the groove region GR2 in the second axis direction disposed between the third cutting region S3 and the fourth cutting region S4, is greater than that of other groove regions GR1. In example embodiments, to block or substantially block an emitted light in the groove regions, the display device may further include a shielding member, a case member, etc., which can cover or block the groove regions.

The display panel 170 may completely remove or substantially remove a dead space (e.g., a peripheral region) of the display panel 170 adjacent to the display unit 140 using (or utilizing) the groove region GR. The dead space may be disposed on a lower surface of the display panel 170. When the dead space is disposed adjacent to the display unit 140, a bezel (e.g., a border, an edge, etc.) of the display panel 170 may be decreased.

Referring to FIG. 13A, the groove regions GR1 and GR2 along the outer boundary of the display unit 140 may be formed. As described above, the groove regions GR1 and GR2 to be formed at least a portion of the additional structures is illustrated after the additional structures (e.g., a bottom member, a top member, an adhesive, a touch screen panel, a transparent member, etc.) are disposed at the top and bottom portions of the display panel 170. Thus, the transparent member, the touch screen panel, the polarizer, the bottom film, etc. may be additionally formed on an upper surface (e.g., in the third axis direction) of the display panel 170 or a lower surface (e.g., in a direction opposite to the third axis direction). The groove regions GR1 and GR2 may substantially be rectangle shapes. The display panel 170 is cut along the boundaries at the lines D-D', E-E', F-F', and G-G' of the display panel 170, before the display panel 170 is bent at the groove regions GR1 and GR2. When a portion of the display panel 170 is cut along the boundaries, the display panel 170 may be readily bent at the groove regions GR1 and GR2.

Referring to FIG. 13B, the display panel 170 may include the first cutting region S1 which is cut along the boundary line D-D' of the display device, the second cutting region S2 which is cut along the boundary line E-E' of the display device, the third cutting region S3 which is cut along the boundary line F-F' of the display device, and the fourth cutting region S4 which is cut along the boundary line G-G' of the display device.

Referring to FIG. 13C, the display panel 170 which is bent using (or utilizing) the groove regions GR1 and GR2 of the display panel 170 may completely remove the dead space adjacent to the display panel 170. Here, the dead space may be disposed on a lower surface of the display panel 170. In this way, the display panel 170 may be implemented with a dead space free structure at the peripheral region adjacent to the display panel 170 using (or utilizing) the groove regions GR1 and GR2.

Aspects of example embodiments of the present invention may be applied to any display device having the groove regions. For example, the aspects of example embodiments may be applied to the mobile phone, the smart phone, the laptop computer, the tablet computer, the personal digital assistant (PDA), the portable multimedia player (PMP), the digital camera, the music player (e.g., a MP3 player), the portable game console, the navigation, etc.

The foregoing is illustrative of example embodiments only, and is not to be construed as limiting thereof. Although a few example embodiments have been described, those having ordinary skill in the art will readily appreciate that various modifications are possible in the example embodiments without materially departing from the spirit and scope of the present invention. Accordingly, all such modifications are intended to be included within the scope of example embodiments as defined in the claims, and their equivalents. In the claims, means-plus-function clauses, if any, are intended to cover the structures described herein as performing the recited function and not only structural equivalents but also equivalent structures. Therefore, while certain embodiments of the present invention have been illustrated and described, it is understood by those of ordinary skill in the art that certain modifications and changes can be made to the described embodiments without departing from the spirit and scope of the present invention as defined by the following claims, and equivalents thereof.

What is claimed is:

1. A display device comprising:
   a display panel having a first region, a second region, and a third region between the first and second regions, the display panel including:
   a display unit disposed in the first region; and
   a pad unit disposed in the second region; and
   a bottom member disposed in the first and second regions on a lower surface of the display panel, the bottom member having a first opening located between the first and second regions, and the first opening exposing the display panel therethrough,
   wherein the display panel is bent between the first and second regions on an axis with respect to a first direction, and
   wherein a width in the first direction of the third region is smaller than widths in the first direction of the first and second regions.

2. The display device of claim 1, wherein the first opening is formed by removing the bottom member between the first and second regions.

3. The display device of claim 1, wherein the bottom member includes:
   a first bottom pattern disposed in the first region; and
   a second bottom pattern disposed in the second region,
   wherein the first bottom pattern is spaced apart from the second bottom pattern.

4. The display device of claim 1, wherein the bottom member includes PSA films or PET films.

5. The display device of claim 1, wherein the pad unit is electrically connected to an external module configuration.

6. The display device of claim 5, wherein a driving integrated circuit is disposed in the pad unit.

7. The display device of claim 5, further comprising:
   a chip on film connected to the pad unit,
   wherein the pad unit is connected to the external module configuration through the chip on film.

8. The display device of claim 1, wherein the display unit has a first side, a second side facing the first side, a third side between the first and second sides, a fourth side facing the third side, and
   wherein the pad unit is located adjacent to the first side.

9. The display device of claim 8, wherein the display panel further includes first, second, and third peripheral units located adjacent to the second, third, and fourth sides, respectively, and
   wherein a plurality of wirings are disposed in the first, second, and third peripheral units.

10. The display device of claim 9, wherein the bottom member further includes second, third, fourth openings,
    wherein the second, third, fourth openings are located in at least a portion of each of the first, second, and third peripheral units, and the second, third, fourth openings are located adjacent to the display unit, and
    wherein the second, third, and fourth openings are formed by removing the bottom member in which the first, second, and third peripheral units are disposed.

11. The display device of claim 9, wherein the second peripheral unit is spaced apart from the pad unit, and the third peripheral unit is spaced apart from the pad unit.

12. The display device of claim 9, wherein the first peripheral unit is spaced apart from the second and third peripheral units.

13. A display device comprising:
    a display panel having a first region, a second region, and a third region between the first and second regions, the display panel including:
    a display unit disposed in the first region; and
    a pad unit disposed in the second region; and
    a bottom member disposed in the first and second regions on a lower surface of the display panel, the bottom member having a first opening located between the first and second regions,
    wherein the display panel is bent between the first and second regions on an axis with respect to a first direction,
    wherein a width in the first direction of the third region is smaller than widths in the first direction of the first and second regions,
    wherein the display unit has a first side, a second side facing the first side, a third side between the first and second sides, and a fourth side facing the third side,
    wherein the pad unit is located adjacent to the first side,
    wherein the display panel further includes first, second, and third peripheral units located adjacent to the second, third, and fourth sides, respectively,
    wherein a plurality of wirings are disposed in the first, second, and third peripheral units,
    wherein the display panel further comprises:
    a first cutting region where the first and second peripheral units are adjacent to each other;
    a second cutting region where the first and third peripheral units are adjacent to each other;
    a third cutting region where the second peripheral unit and the third region are adjacent to each other; and
    a fourth cutting region where the third peripheral unit and the third region are adjacent to each other.

14. The display device of claim 13, wherein each of the first and second cutting regions has a planar shape of a triangle, and each of the third and fourth cutting regions has a planar shape of a tetragon.

15. The display device of claim 14, wherein a shape of the display panel is defined such that the display panel is not located in the first, second, third, and fourth cutting regions.

16. The display device of claim 14, wherein portions of the peripheral unit that are respectively located in the first, second, third, and fourth cutting regions are removed.

17. The display device of claim 1, wherein the display panel further includes:
    a peripheral unit surrounding the display unit; and
    a corner cut located adjacent to a portion of the peripheral unit.

18. The display device of claim 17, wherein the display panel has a boundary line that is located at a boundary of the peripheral unit and the corner cut, and wherein the corner cut is removed after the display panel is cut along the boundary line.

19. The display device of claim 1, further comprising:

a touch screen panel disposed on the display panel.

20. The display device of claim 19, wherein the touch screen panel includes a touch screen panel wire disposed on the display panel, and the touch screen panel wire is disposed between the first region and second region.

21. The display device of claim 1, further comprising:

a transparent member disposed on the display panel, wherein the transparent member includes a plastic window.

22. The display device of claim 1, wherein the first region is spaced apart from the second region, and the first region, the third region, and the second region are continuously arranged.

23. A display device comprising:

a display panel having a first region, a second region, and a third region between the first and second regions, the display panel including:

a display unit disposed in the first region; and a pad unit disposed in the second region; and a bottom member disposed on a lower surface of the display panel, the bottom member having a first groove region between the first and second regions, wherein the display panel is bent between the first and second regions on an axis with respect to a first direction, wherein a width in the first direction of the third region is smaller than respective widths in the first direction of the first and second regions, and wherein the first groove region corresponds to the third region of the display panel.

24. The display device of claim 23, wherein the first groove region is formed by removing at least a portion of the bottom member between the first and second regions.

25. The display device of claim 23, wherein the first groove region is formed by completely removing the bottom member between the first and second regions.

26. The display device of claim 23, wherein the display unit has a first side, a second side facing the first side, a third side between the first and second sides, a fourth side facing the third side, and wherein the pad unit is located adjacent to the first side.

27. The display device of claim 26, wherein the display panel further includes first, second, and third peripheral units located adjacent to the second, third, and fourth sides, respectively, and wherein a plurality of wirings are disposed in the first, second, and third peripheral units.

28. The display device of claim 27, wherein the bottom member further includes second, third, fourth groove regions, wherein the second, third, fourth groove regions are located in at least a portion of each of the first, second, and third peripheral units, and the second, third, fourth groove regions are located adjacent to the display unit, and wherein the second, third, and fourth groove regions are formed by removing at least a portion of the bottom member in which the first, second, and third peripheral units are disposed.

29. The display device of claim 23, wherein the first region is spaced apart from the second region, and the first region, the third region, and the second region are continuously arranged.

* * * * *